US007830466B2

(12) United States Patent
Choi

(10) Patent No.: US 7,830,466 B2
(45) Date of Patent: Nov. 9, 2010

(54) ARRAY SUBSTRATE FOR ORGANIC THIN FILM TRANSISTOR LIQUID CRYSTAL DISPLAY DEVICE AND METHOD OF MANUFACTURING THE SAME

(75) Inventor: Naek Bong Choi, Seoul (KR)

(73) Assignee: LG Display Co., Ltd., Seoul (KR)

( * ) Notice: Subject to any disclaimer, the term of this patent is extended or adjusted under 35 U.S.C. 154(b) by 451 days.

(21) Appl. No.: 11/892,656

(22) Filed: Aug. 24, 2007

(65) Prior Publication Data

US 2008/0049158 A1    Feb. 28, 2008

(30) Foreign Application Priority Data

Aug. 24, 2006    (KR) .................. 10-2006-0080558

(51) Int. Cl.
*G02F 1/136* (2006.01)
*H01L 21/02* (2006.01)

(52) U.S. Cl. .................. 349/46; 349/122; 349/138; 257/E21.535

(58) Field of Classification Search .................. 349/46, 349/43, 56, 58, 138, 139, 158, 122; 257/E21.535
See application file for complete search history.

(56) References Cited

U.S. PATENT DOCUMENTS 7,489,368 B2* 2/2009 Kim et al. ................. 349/43

| 2006/0081849 A1* | 4/2006 | Lee et al. ................. 257/72 |
| 2007/0131926 A1* | 6/2007 | Lee et al. ................. 257/40 |
| 2007/0152210 A1* | 7/2007 | Han et al. ................. 257/40 |
| 2007/0153171 A1* | 7/2007 | Kim ................. 349/114 |
| 2008/0049158 A1* | 2/2008 | Choi ................. 349/46 |

FOREIGN PATENT DOCUMENTS

| CN | 1716065 A | 1/2006 |
| JP | 2006-024790 | 1/2006 |

\* cited by examiner

*Primary Examiner*—Brian M Healy
(74) *Attorney, Agent, or Firm*—McKenna Long & Aldridge

(57) ABSTRACT

An array substrate for an organic thin film transistor liquid crystal display device includes a substrate; a data line on the substrate; a first gate line crossing the data line to define a pixel region; an organic thin film transistor electrically connected to the first gate line and the data line, the organic thin film transistor including source and drain electrodes, an organic semiconductor layer on the source and drain electrodes, a gate electrode on the organic semiconductor layer; a pixel electrode in the pixel region and connected to the drain electrode; a gate pad terminal electrically connected to the first gate line and formed of a transparent conductive material; a data pad terminal electrically connected to the data line and formed of a transparent conductive material; and a passivation layer covering the organic thin film transistor and exposing the pixel electrode, the gate pad terminal, and the data pad terminal.

9 Claims, 30 Drawing Sheets

ARRAY SUBSTRATE FOR ORGANIC THIN FILM TRANSISTOR LIQUID CRYSTAL DISPLAY DEVICE AND METHOD OF MANUFACTURING THE SAME

The invention claims the benefit of Korean Patent Application No. 2006-0080558 filed in Korea on Aug. 24, 2006, which is hereby incorporated by reference for all purposes as if fully set forth herein.

BACKGROUND OF THE INVENTION

1. Field of the Invention

The invention relates to a liquid crystal display device, and more particularly, to an array substrate for a liquid crystal display device including organic thin film transistors and a method of manufacturing the same, in which a metallic material of pad portions can be prevented from being torn apart and corroded during a packaging process of tape automated bonding (TAB).

2. Discussion of the Related Art

Due to the rapid development in information technology, various display devices have evolved into instruments that can process and display a great deal of information. Flat panel display (FPD) devices, such as liquid crystal display (LCD) devices, plasma display panels (PDPs), vacuum fluorescent display (VFD) devices, and electroluminescent display (ELD) devices, have been developed.

Among these devices, liquid crystal display (LCD) devices are most widely used in place of cathode ray tubes (CRTs) due to their lightweight, thin thickness and low power consumption. The LCD devices are used not only for potable devices such as monitors of notebook computers but also for televisions and monitors of personal computers.

An LCD device includes thin film transistors as switching elements. In general, silicon is used as an active layer of the thin film transistor.

Recently, polyacetylene, which is a conjugated organic polymer having semiconductor properties, has been developed. Organic semiconductors have been researched as new electrical and electronic materials in a wide range of functional electronic devices, optical devices, etc. due to various synthesizing methods, ease to form thin films, flexibility, conductivity, and low production costs. Organic thin film transistors (OTFTs), which have substantially the same structure as silicon thin film transistors (Si-TFTs) and include an organic material as an active layer, have been researched and developed.

FIG. 1 is a plane view of an array substrate for an organic thin film transistor (OTFT) liquid crystal display (LCD) device according to the related art. In FIG. 1, gate lines 20 are formed along a direction on a substrate 10, and a gate pad 40 is disposed at one end of each of the gate lines 20. Data lines 30 cross the gate lines 20 to define pixel regions P, and a data pad 50 is disposed at one end of each of the data lines 30.

An organic thin film transistor OT is formed at each crossing point of the gate lines 20 and the data lines 30. The organic thin film transistor OT includes a source electrode 32 that extends from the data line 30, a drain electrode 34 that is spaced apart from the source electrode 32, a gate electrode 36 that extends from the gate line 20 over the source and drain electrodes 32 and 34, and an organic semiconductor layer (not shown) that is disposed between the gate electrode 36 and each of the source electrode 32 and the drain electrode 34.

A pixel electrode 70 is formed in the pixel region P. The pixel electrode 70 directly contacts the drain electrode 34 and is spaced apart from the gate line 20, the data line 30, and the organic thin film transistor OT, particularly, the gate electrode 36 and the source electrode 32.

Hereinafter, a method of manufacturing an array substrate for an OTFT LCD device according to the related art will be described with reference to accompanying drawings.

FIGS. 2A to 2F, FIGS. 3A to 3F, and FIGS. 4A to 4F illustrate a method of manufacturing an array substrate for an OTFT LCD device according to the related art. FIGS. 2A to 2F are cross-sectional views along the line II-II of FIG. 1, FIGS. 3A to 3F are cross-sectional views along the line III-III of FIG. 1, and FIGS. 4A to 4F are cross-sectional views along the line IV-IV of FIG. 1.

In FIG. 2A, FIG. 3A and FIG. 4A, a switching region S, a pixel region P, a gate region G, and a data region D are defined on a substrate 10.

A metallic material is deposited on the substrate 10 where the regions S, P, G and D are defined and then is patterned to thereby form a source electrode 32, a drain electrode 34, and a data line 30 of FIG. 1. The source and drain electrodes 32 and 34 correspond to the switching region S. The data line 30 corresponds to the data region D and has a data pad 50 at one end thereof. The metallic material may be one or more selected from a conductive metallic group including aluminum (Al), aluminum alloy such as aluminum neodymium (AlNd), molybdenum (Mo), tungsten (W), and chromium (Cr).

In FIG. 2B, FIG. 3B and FIG. 4B, a transparent conductive material is deposited on the substrate 10 including the source and drain electrodes 32 and 34 and then is patterned to thereby form a pixel electrode 70 and a data pad terminal 52. The pixel electrode 70 directly contacts a part of the drain electrode 34. The data pad terminal 52 is disposed in the data region D and contacts the data pad 50. The transparent conductive material may be one of indium tin oxide (ITO) and indium zinc oxide (IZO).

In FIG. 2C, FIG. 3C and FIG. 4C, a low molecular organic material layer 45a is formed substantially on an entire surface of the substrate 10 including the pixel electrode 70 by applying one selected from a low molecular organic material group. Subsequently, an organic insulating layer 55a is formed on the low molecular organic material layer 45a.

In FIG. 2D, FIG. 3D and FIG. 4D, the low molecular organic material layer 45a and the organic insulating layer 55a are patterned to thereby form an organic semiconductor layer 45 and a gate insulating layer 55 in the switching region S. The organic semiconductor layer 45 and the gate insulating layer 55 thereon have the same width.

The source and drain electrodes 32 and 34 are spaced apart from each other. The organic semiconductor layer 45 and the gate insulating layer 55 overlap the source and drain electrodes 32 and 34.

In FIG. 2E, FIG. 3E and FIG. 4E, a metallic material is deposited substantially on an entire surface of the substrate 10 including the organic semiconductor layer 45 and the gate insulating layer 55 and then is patterned to thereby form a gate electrode 36, a gate line 20 of FIG. 1 and a gate pad 40. The gate electrode 36 is disposed on the gate insulating layer 55 and has the same width with the gate insulating layer 55. The gate line 20 is disposed in the gate region G and is connected to the gate electrode 36. The gate pad 40 is disposed at one end of the gate line 20. The gate pad 40 is part of the gate line 20 and is electrically connected to the gate line 20. The metallic material may be selected from a metallic material group including aluminum (Al), aluminum alloy such as aluminum neodymium (AlNd), molybdenum (Mo), tungsten (W) and chromium (Cr).

In FIG. 2F, FIG. 3F and FIG. 4F, a passivation layer 60 is formed substantially on an entire surface of the substrate 10. The passivation layer 60 may be one or more selected from an organic insulating material group. The passivation layer 60 is patterned to thereby form a gate pad contact hole CH1, a data pad contact hole CH2, and a pixel opening OH. The gate pad contact hole CH1 partially exposes the gate pad 40. The data pad contact hole CH2 partially exposes the data pad terminal 52. The pixel opening OH exposes the pixel electrode 70.

An array substrate according to the related art may be manufactured through the above-mentioned processes.

In an LCD device including the array substrate having an organic TFT of a top gate type, in which the gate electrode 36 is disposed over the source and drain electrodes 32 and 34, the gate pad 40 is formed of the same material as the gate electrode 36, i.e., one selected from a conductive metallic group, and there may be problems when a gate driver is connected to the gate pad according to a TAB (tape automated bonding) package method. That is, when the gate driver is connected to the gate pad, misalignment may occur. To connect the gate driver to the gate pad again, when the gate driver is detached from the gate pad, the gate pad is torn off. Additionally, the gate pad is exposed to atmospheric conditions, and thus the gate pad is corroded.

SUMMARY OF THE INVENTION

Accordingly, the present invention is directed to an array substrate for an organic thin film transistor liquid crystal display device and a method of manufacturing the same that substantially obviate one or more of the problems due to limitations and disadvantages of the related art.

An advantage of the present invention is to provide an array substrate for an organic thin film transistor liquid crystal display device and a method of manufacturing the same that have a gate pad structure including a transparent conductive material.

Another advantage of the present invention is to provide an array substrate for an organic thin film transistor liquid crystal display device and a method of manufacturing the same that enable a package process to be repeatedly performed without a gate pad structure torn off or corroded.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of embodiments of the invention, as embodied and broadly described, an array substrate for an organic thin film transistor liquid crystal display device includes a substrate; a data line on the substrate; a first gate line crossing the data line to define a pixel region; an organic thin film transistor electrically connected to the first gate line and the data line, the organic thin film transistor including source and drain electrodes, an organic semiconductor layer on the source and drain electrodes, a gate electrode on the organic semiconductor layer; a pixel electrode in the pixel region and connected to the drain electrode; a gate pad terminal electrically connected to the first gate line and including a transparent conductive material; a data pad terminal electrically connected to the data line and including a transparent conductive material; and a passivation layer covering the organic thin film transistor and exposing the pixel electrode, the gate pad terminal, and the data pad terminal.

In another aspect, a method of manufacturing an array substrate for a liquid crystal display device includes forming source and drain electrodes and a data line on a substrate; forming a pixel electrode, a gate pad terminal and a data pad terminal by depositing and patterning a transparent conductive material, the pixel electrode contacting the drain electrode, and the data pad terminal electrically connected to the data line; forming an organic semiconductor layer on the source and drain electrodes; forming a gate insulating layer formed on the organic semiconductor layer; forming a gate electrode and a gate line on the gate insulating layer, the gate pad terminal electrically connected to the gate line; and forming a passivation layer on the gate electrode and the gate line, the passivation layer exposing the pixel electrode, the gate pad terminal, and the data pad terminal.

In another aspect, a method of manufacturing an array substrate for a liquid crystal display device includes forming source and drain electrodes and a data line on a substrate; forming a pixel electrode, a gate pad terminal and a data pad terminal by depositing and patterning a transparent conductive material, the pixel electrode contacting the drain electrode, and the data pad terminal electrically connected to the data line; forming an organic semiconductor layer on the source and drain electrodes; forming a gate insulating layer formed on the organic semiconductor layer; forming a gate electrode on the gate insulating layer; forming a passivation layer on the gate electrode and the gate line, the passivation layer exposing the pixel electrode, the gate pad terminal, and the data pad terminal; and forming a gate line on the passivation layer, the gate line connected to the gate electrode and the gate pad terminal.

In another aspect, a method of manufacturing an array substrate for a liquid crystal display device includes forming a data line on a substrate; forming a gate line crossing the data line to define a pixel region; forming an organic thin film transistor electrically connected to the gate and data lines, the organic thin film transistor including source and drain electrodes, an organic semiconductor layer on the source and drain electrodes, a gate electrode on the organic semiconductor layer; forming a pixel electrode in the pixel region and connected to the drain electrode; forming a gate pad terminal and a data pad terminal by depositing and patterning a transparent conductive material, the gate pad terminal electrically connected to the gate line, and the data pad terminal electrically connected to the data line; and forming a passivation layer covering the organic thin film transistor and exposing the pixel electrode, the gate pad terminal, and the data pad terminal.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to embodiments of the present invention, examples of which are illustrated in the accompanying drawings.

Figure 1:
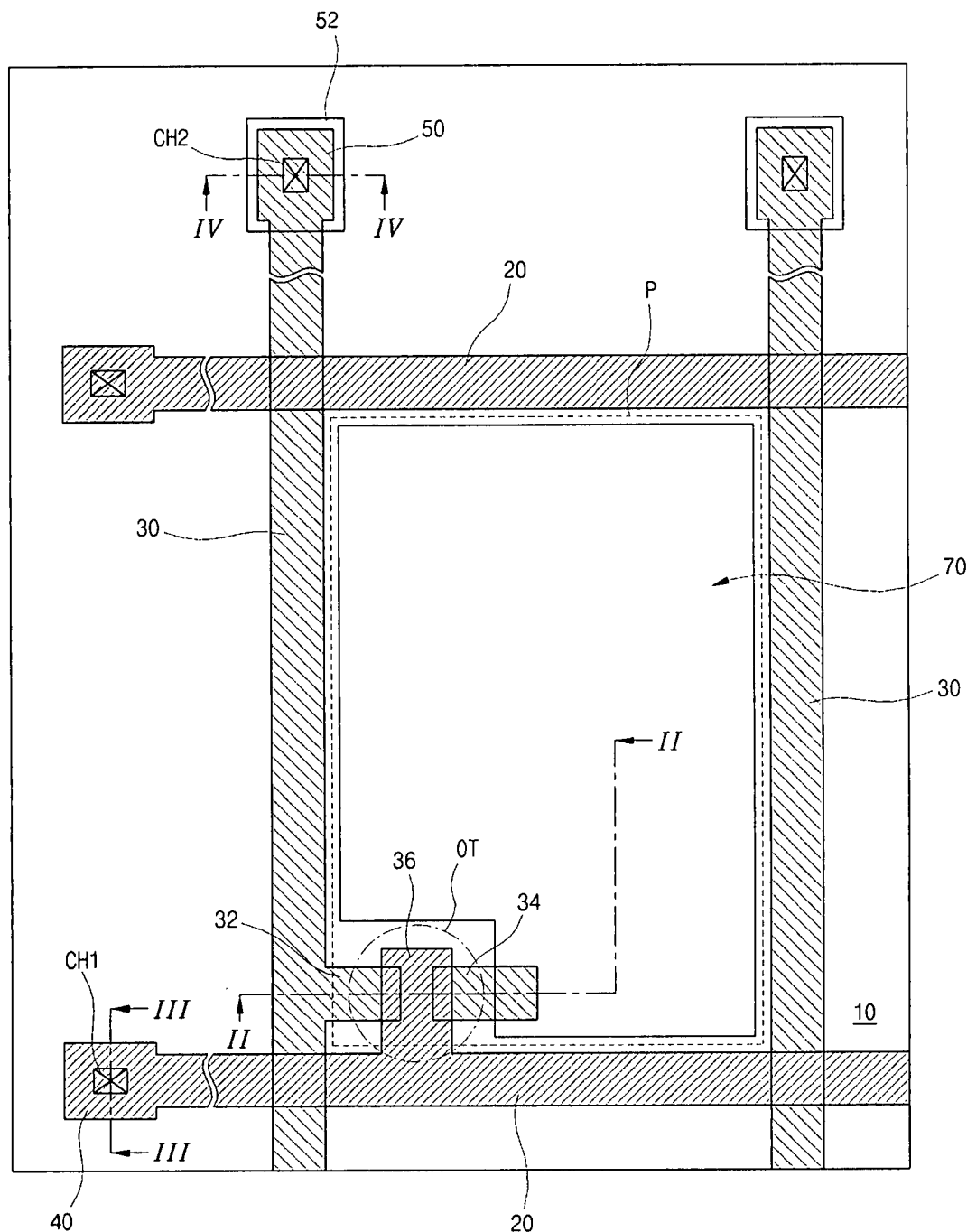
FIG. 1 is a plane view of an array substrate for an organic thin film transistor (OTFT) liquid crystal display (LCD) device according to the related art.
Figure 2A:
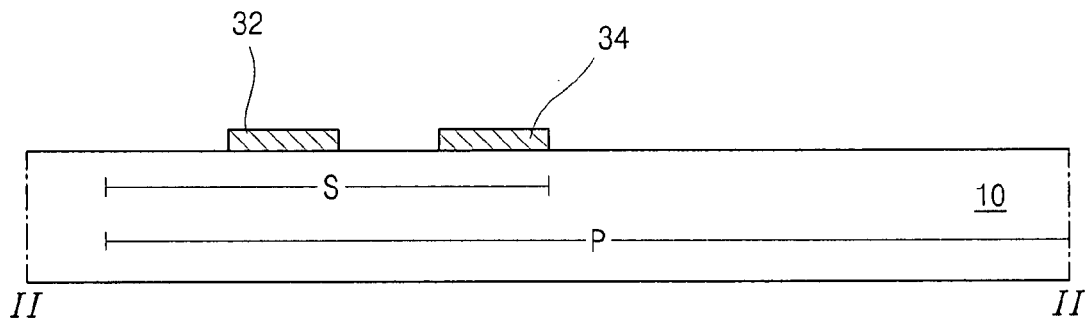
FIGS. 2A to 2F, FIGS. 3A to 3F and FIGS. 4A to 4F are cross-sectional views illustrating a method of manufacturing an array substrate for an OTFT LCD device according to the related art.
Figure 2B:
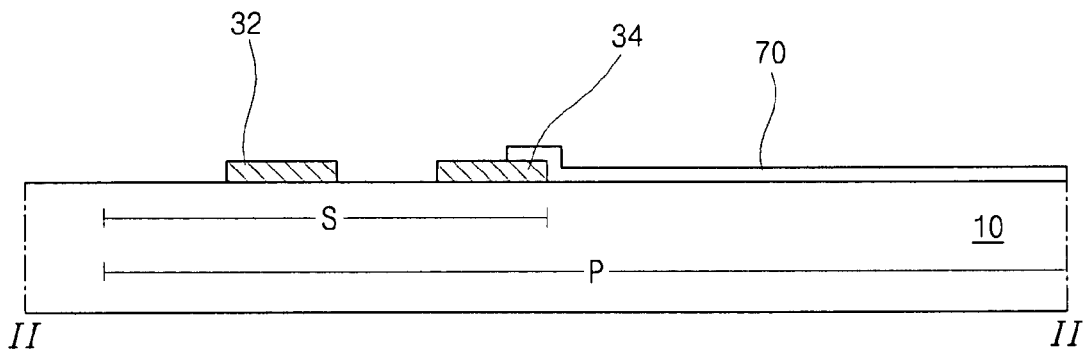
Figure 2C:
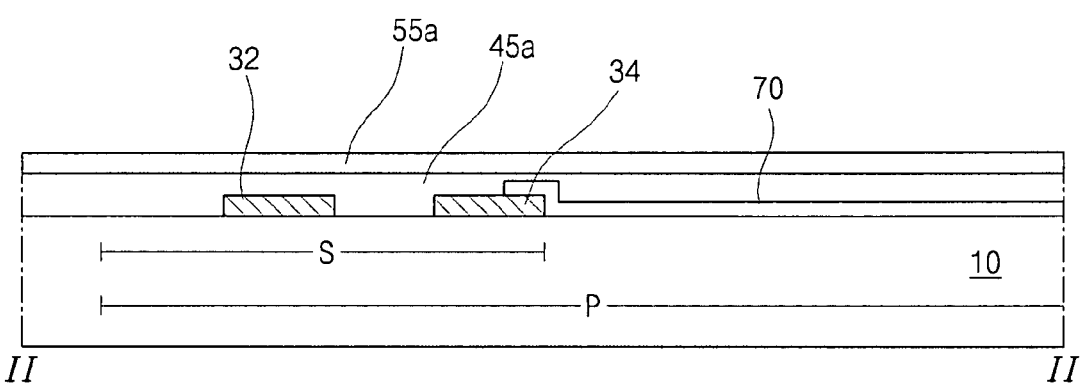
Figure 2D:
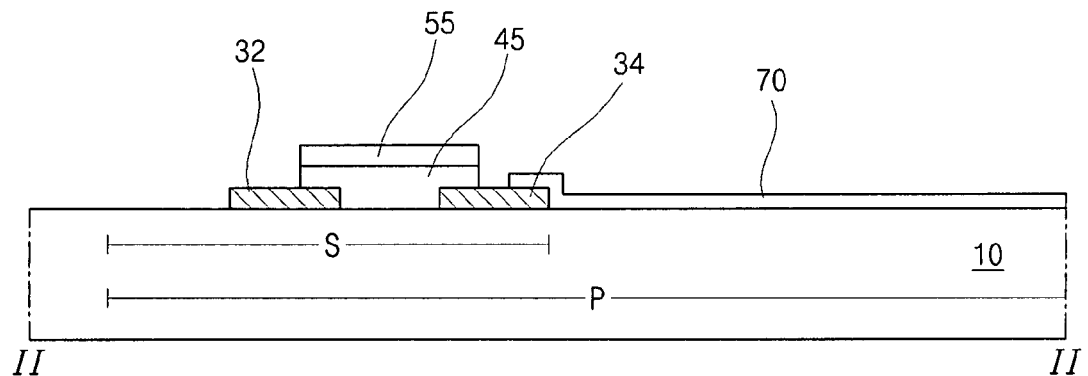
Figure 2E:
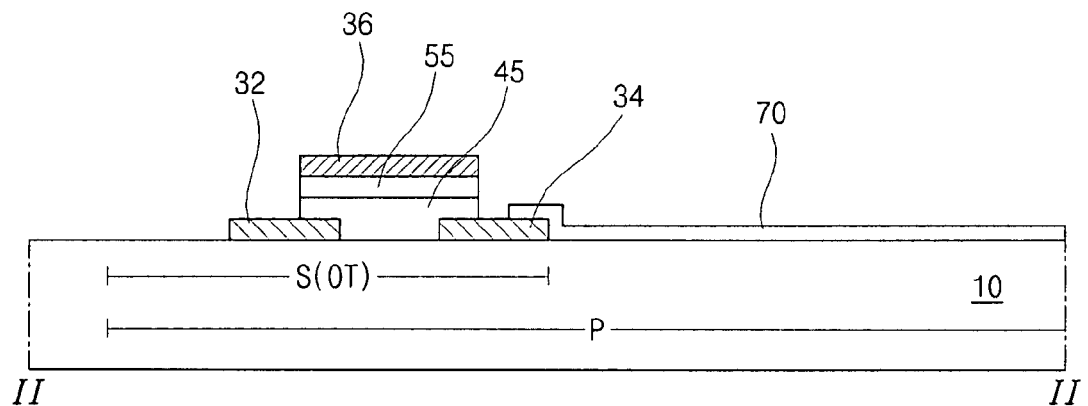
Figure 2F:
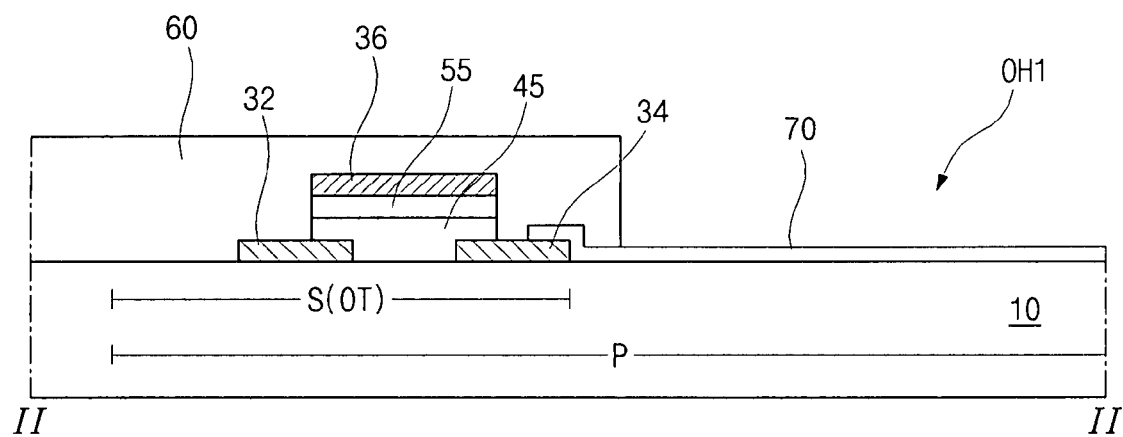
Figure 3A:
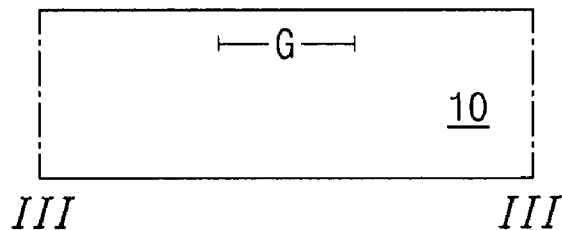
Figure 3B:
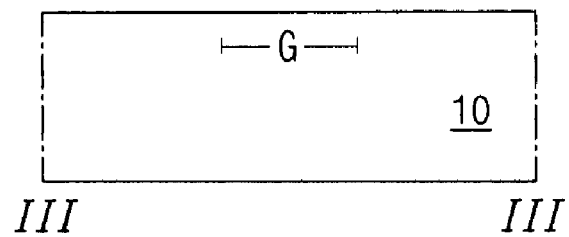
Figure 3C:
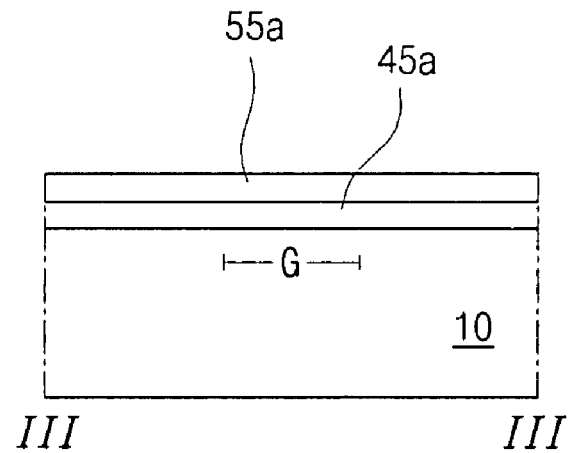
Figure 3D:
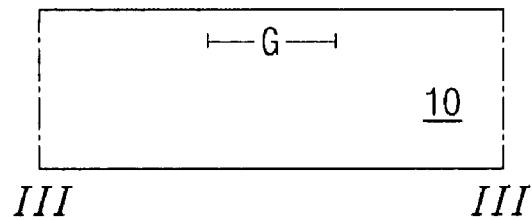
Figure 3E:
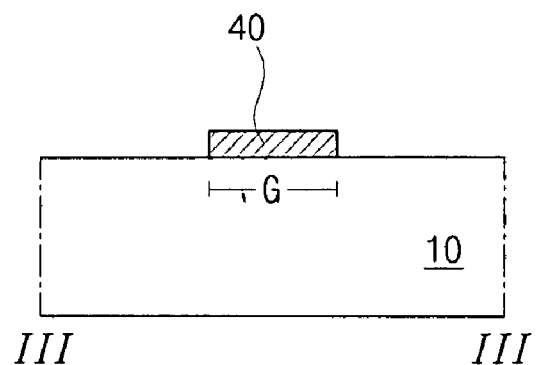
Figure 3F:
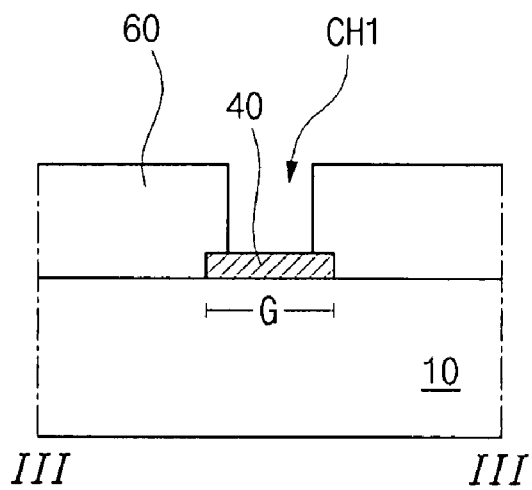
Figure 4A:
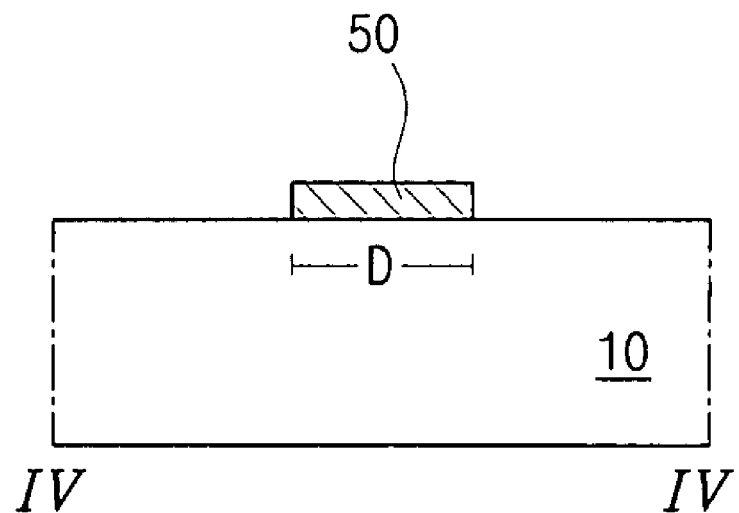
Figure 4B:
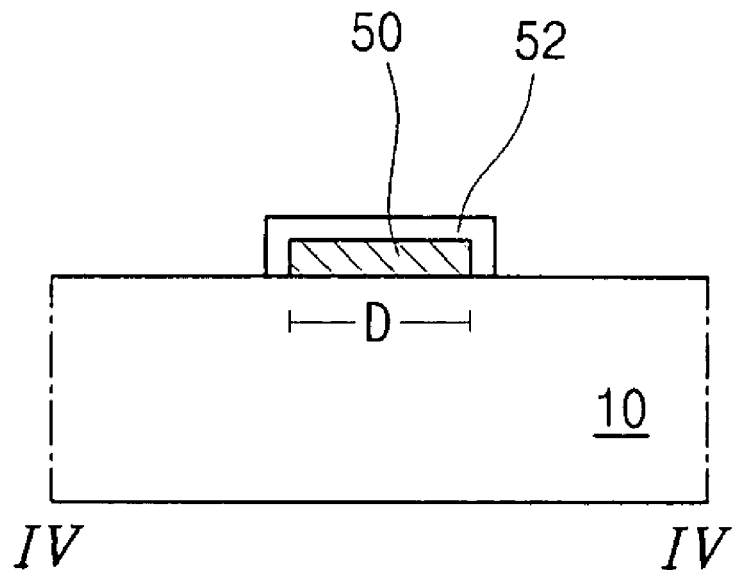
Figure 4C:
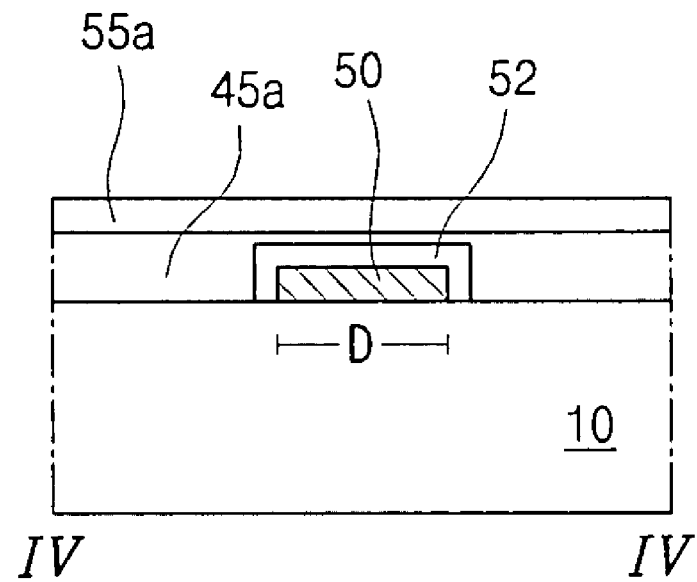
Figure 4D:
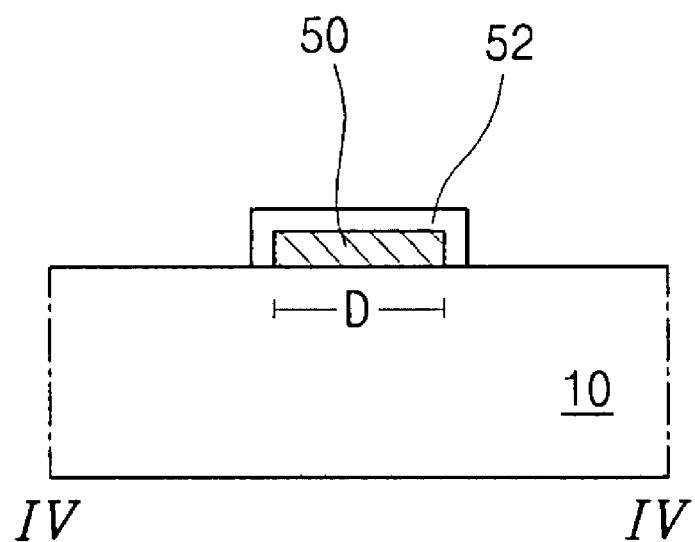
Figure 4E:
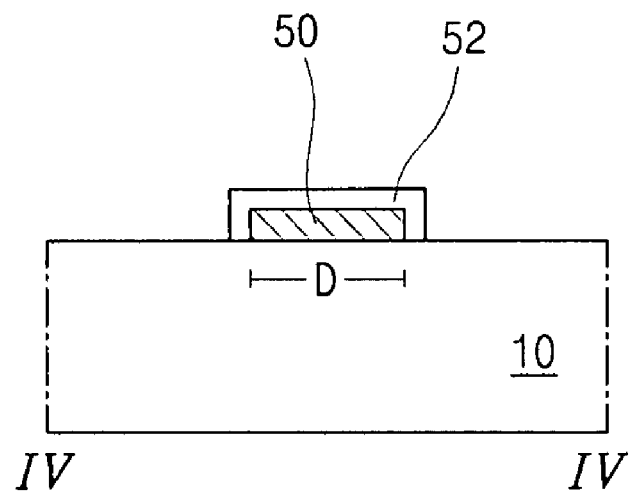
Figure 4F:
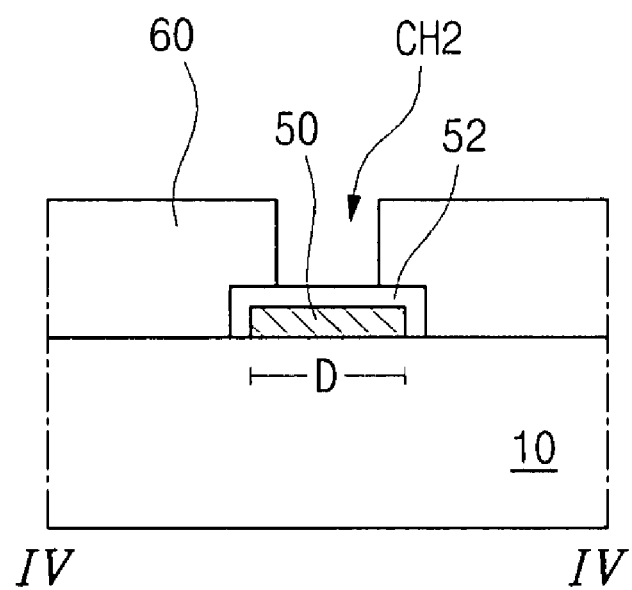
Figure 5:
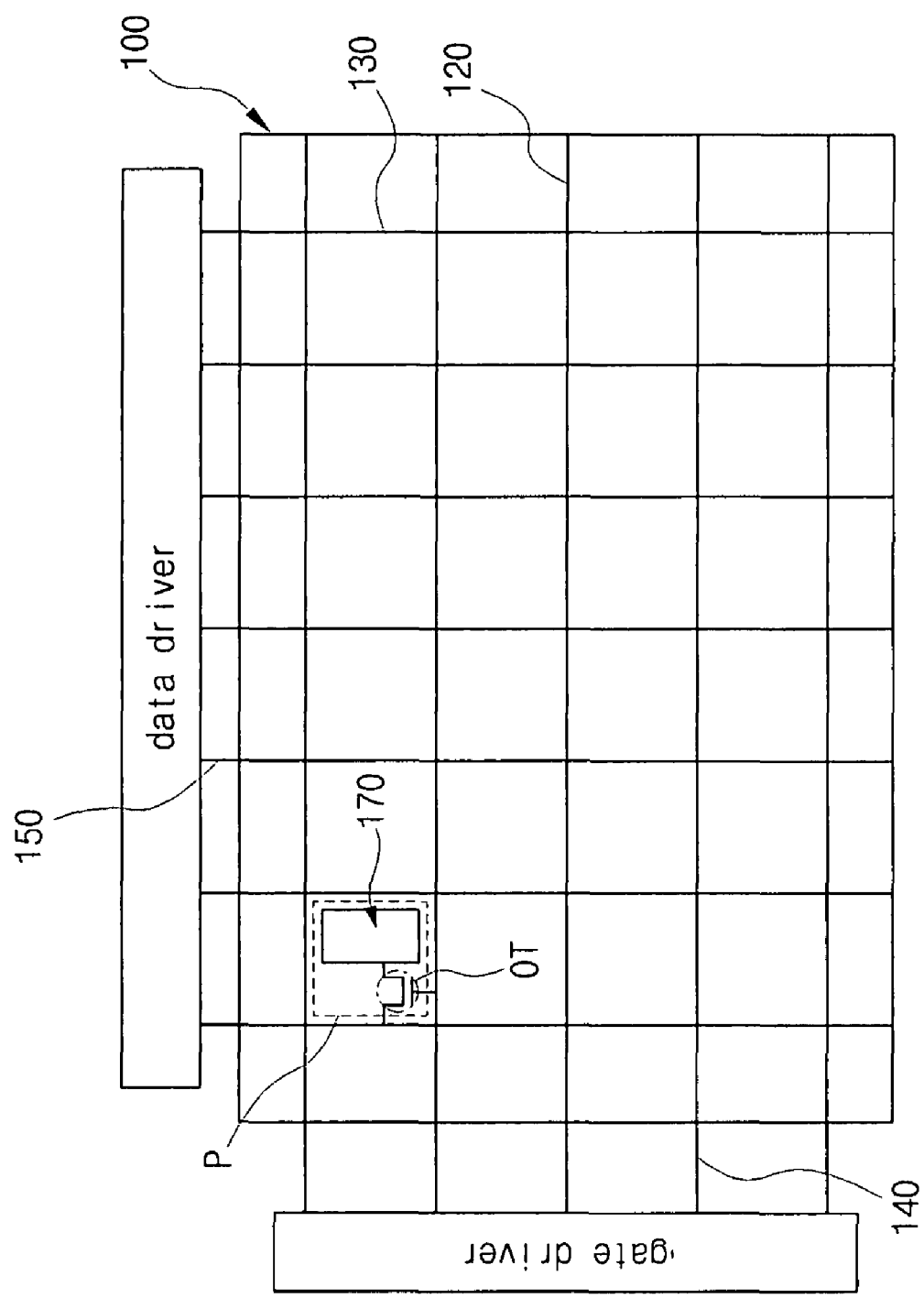
FIG. 5 is a schematic plane view illustrating an array substrate for an OTFT LCD device according to the invention.

FIG. 5 is a schematic plane view illustrating an array substrate for an organic thin film transistor (OTFT) liquid crystal display (LCD) device according to the invention. In FIG. 5, gate lines 120 are formed on a substrate 100 along a first direction. A gate pad 140 is disposed at one end of each of the gate lines 120, more particularly, a left end of each of the gate lines 120 in the context of the figure, and is electrically connected to the corresponding gate line 120. A gate driver is disposed at a left side of the gate pads 140 in the context of the figure and contacts the gate pads 140.

Data lines 130 are formed on the substrate 100 along a second direction and cross the gate lines 120 to define pixel regions P. A data pad 150 is disposed at one end of each of the data lines 130, more particularly, an upper end of each of the data lines 130 in the context of the figure, and is connected to the corresponding data line 130. A data driver is disposed at an upper side of the data pads 150 in the context of the figure and contacts the data pads 150.

An organic thin film transistor OT is formed at each crossing portion of the gate and data lines 120 and 130. A pixel electrode 170 is formed in each pixel region P and is connected to the organic thin film transistor OT. The organic thin film transistor OT may have a top gate structure.

In the invention, a gate pad portion may be a single-layered structure of a gate pad terminal that is formed of a transparent conductive material or a double-layered structure of a gate pad and a gate pad terminal, wherein the gate pad is formed of a metallic material and the gate pad terminal covers the gate pad and is formed of a transparent conductive material.

Figure 6:
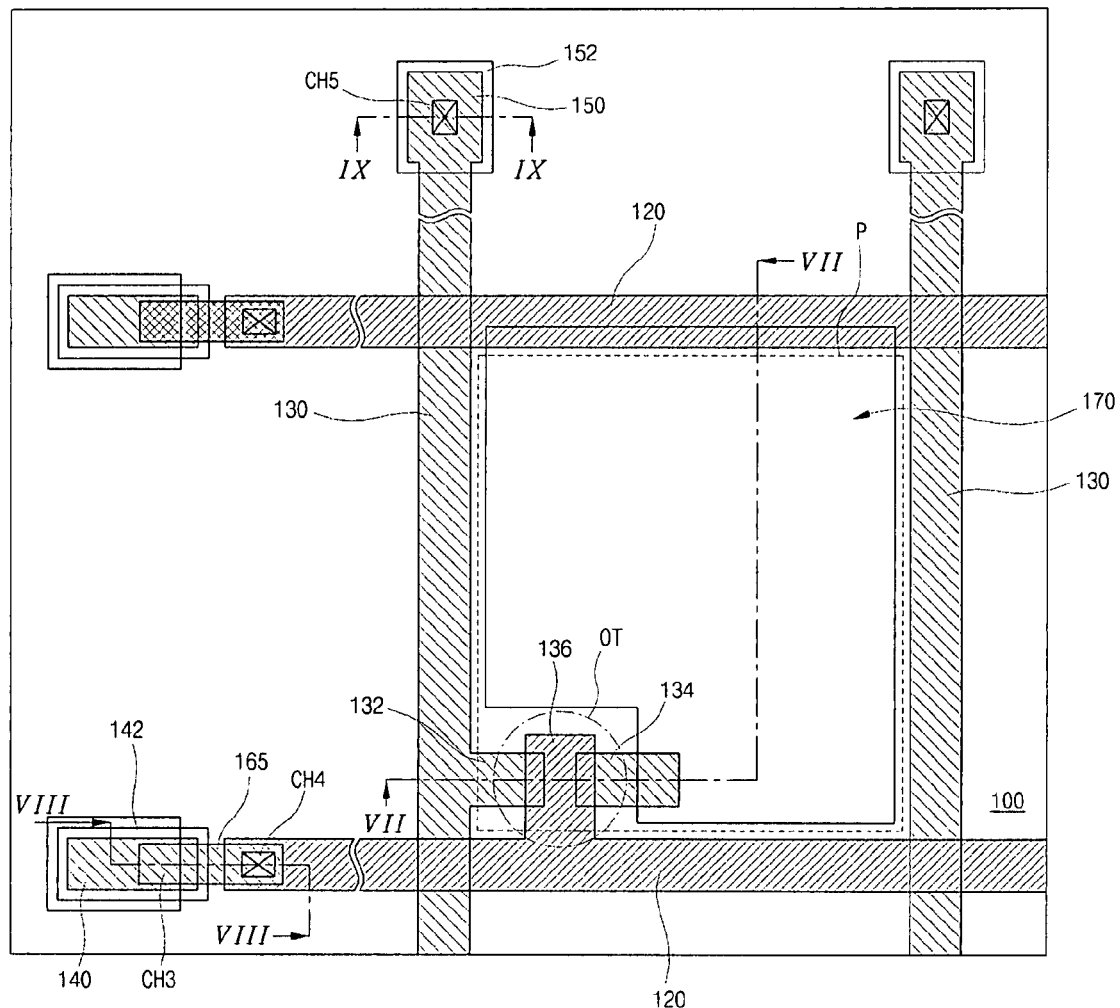
FIG. 6 is a plane view illustrating a pixel of an array substrate for an OTFT LCD device according to a first embodiment of the invention.

FIG. 6 is a plane view illustrating a pixel of an array substrate for an OTFT LCD device according to a first embodiment of the invention. In FIG. 6, gate lines 120 are formed on a substrate 100 along a first direction. A gate pad 140 is formed at one end of each gate line 120. The gate pad 140 has an island shape and is separated from the gate line 120. Data lines 130 are formed along a second direction and perpendicularly cross the gate lines 120 to define pixel regions P. A data pad 150 is formed at one end of each data line 130 and is connected to the data line 130.

A gate pad terminal 142 and a data pad terminal 152 are disposed on the gate pad 140 and the data pad 150, respectively. The gate pad terminal 142 and the data pad terminal 152 are formed of a transparent conductive material. A connecting pattern 165 electrically connects the gate pad 140 and the gate line 120 adjacent thereto.

An organic thin film transistor OT is formed at each crossing portion of the gate and data lines 120 and 130. The organic thin film transistor OT includes a gate electrode 136, an organic semiconductor layer (not shown), a source electrode 132 and a drain electrode 134. The source electrode 132 is connected to the data line 130, and the drain electrode 134 is spaced apart from the source electrode 132. The organic semiconductor layer partially overlaps the source electrode 132 and the drain electrode 134. The gate electrode 136 is connected to the gate line 120 and is disposed over the organic semiconductor layer.

A pixel electrode 170 is formed at each pixel region P. The pixel electrode 170 directly contacts the drain electrode 134. The pixel electrode 170 is spaced apart from the corresponding gate line 120, the data lines 130 and other parts of the organic thin film transistor OT. The pixel electrode 170 partially overlaps another gate line 120 adjacent thereto with a gate insulating layer (not shown) interposed therebetween.

In the array substrate, the gate pad terminal of a transparent conductive material covers the gate pad of an opaque metallic material. Accordingly, even though misalignment occurs during a TAB package process for connecting a gate driver to the gate pad, the package process can be repeatedly performed without the gate pad torn off or corroded.

Hereinafter, a method of manufacturing an array substrate for an OTFT LCD device according to the invention will be described in detail with reference to accompanying drawings.

FIGS. 7A to 7F, FIGS. 8A to 8F, and FIGS. 9A to 9F illustrate a method of manufacturing an array substrate for an OTFT LCD device according to the first embodiment of the invention. FIGS. 7A to 7F are cross-sectional views along the line VII-VII of FIG. 6. FIGS. 8A to 8F are cross-sectional views along the line VIII-VIII of FIG. 6. FIGS. 9A to 9F are cross-sectional views along the line IX-IX of FIG. 6.

Figure 7A:
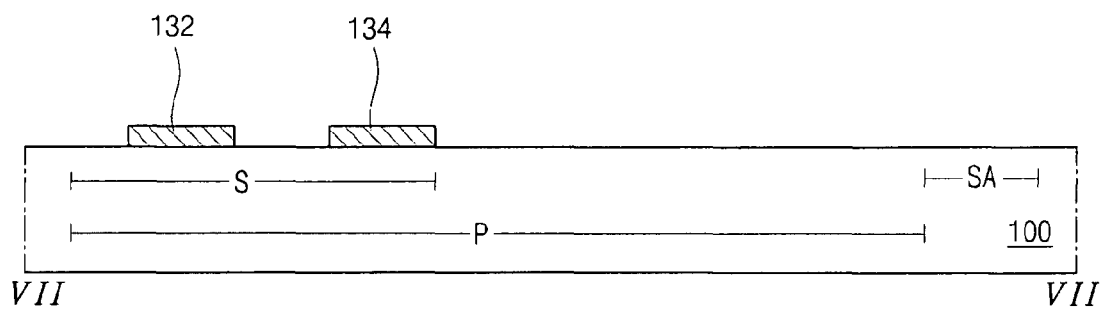
FIGS. 7A to 7F, FIGS. 8A to 8F, and FIGS. 9A to 9F are cross-sectional views illustrating a method of manufacturing an array substrate for an OTFT LCD device according to the first embodiment of the invention.
Figure 8A:
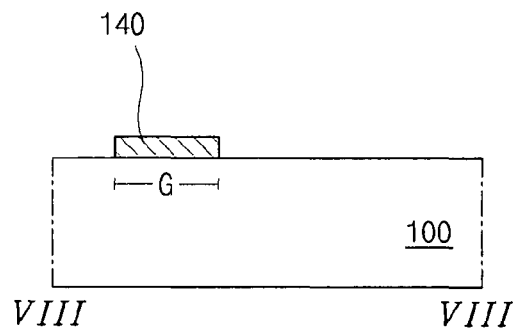
Figure 9A:
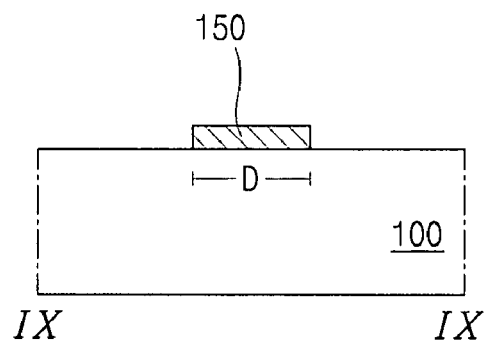

In FIG. 7A, FIG. 8A and FIG. 9A, a switching region S, a pixel region P, a storage region SA, a gate region G, and a data region D are defined on a substrate 100. The storage region SA may be a part of another gate region, which is adjacent to a side of the pixel region P opposite to the gate region G.

A metallic material is deposited on the substrate 100 where the regions S, P, SA, G and D are defined. Then the metallic material is patterned through a photolithographic process, which includes applying, exposing to light and developing photoresist, etching the metallic material, and removing the photoresist, to thereby form a source electrode 132, a drain electrode 134, a gate pad 140 and a data line 130 of FIG. 6. The source and drain electrodes 132 and 134 are disposed in the switching region S. The gate pad 140 is disposed in the gate region G and has an island shape. The data line 130 is disposed in the data region D and has a data pad 150 at one end thereof. The metallic material may be one or more selected from a conductive metallic group including aluminum (Al), aluminum alloy such as aluminum neodymium (AlNd), molybdenum (Mo), tungsten (W), chromium (Cr), and cold (Au).

Here, the gate pad 140 is formed simultaneously with the source and drain electrodes 132 and 134 and is formed in a different layer from the gate line 120 of FIG. 6.

Figure 7B:
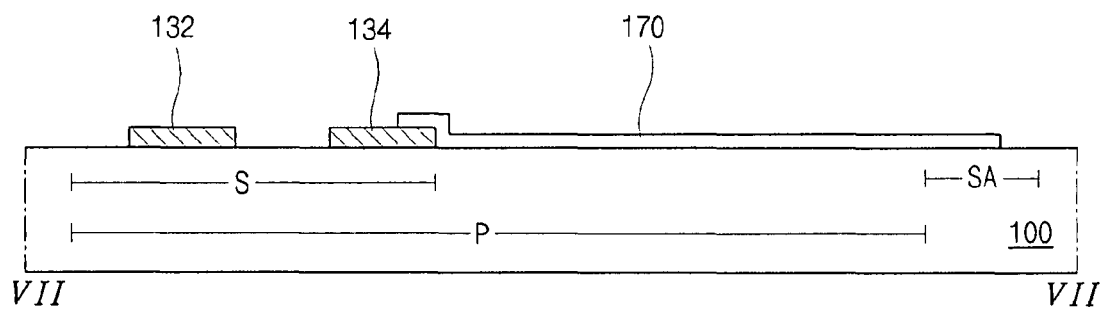
Figure 8B:
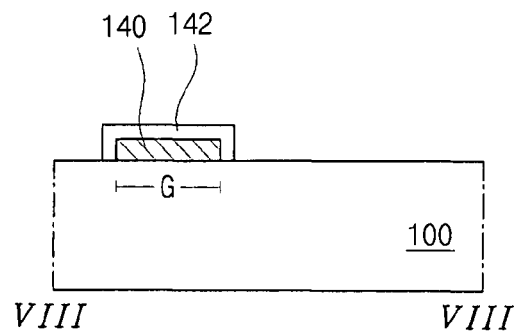
Figure 9B:
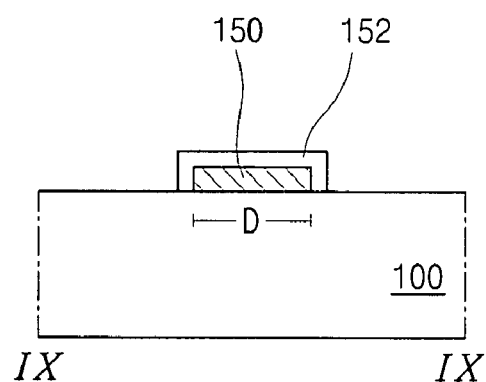

In FIG. 7B, FIG. 8B and FIG. 9B, a transparent conductive material is deposited on the substrate 100 including the source and drain electrodes 132 and 134 and then is patterned to thereby form a pixel electrode 170, a gate pad terminal 142, and a data pad terminal 152. The pixel electrode 170 is disposed in the pixel region P and directly contacts a part of the drain electrode 134. The pixel electrode 170 may be extended into the storage region SA and may function as an electrode of a storage capacitor. The gate pad terminal 142 corresponds to the gate region G and covers the gate pad 140. The data pad terminal 152 corresponds to the data region D and covers the data pad 150. The transparent conductive material may be one selected from a transparent conductive material group including indium tin oxide (ITO) and indium zinc oxide (IZO).

In the invention, the gate pad terminal 142 of a transparent conductive material is formed on the gate pad 140 differently from the related art. The gate pad terminal 142 and the data pad terminal 152 are formed of the same material and in the same layer as the pixel electrode 170. Accordingly, even though misalignment may occur during a TAB package process of electrically connecting a gate driver (not shown) to the gate pad 140, the package process can be repeatedly performed without creating problems. That is, the metallic material of the gate pad 140 is neither torn off nor corroded.

Figure 7C:
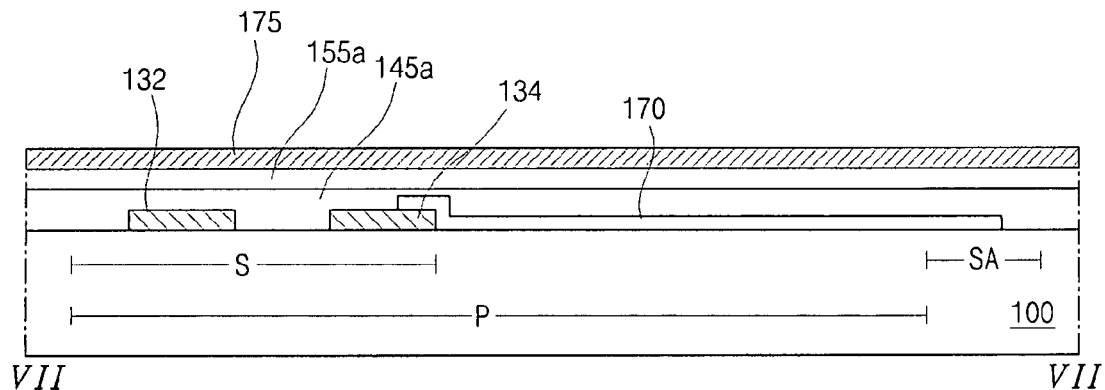
Figure 8C:
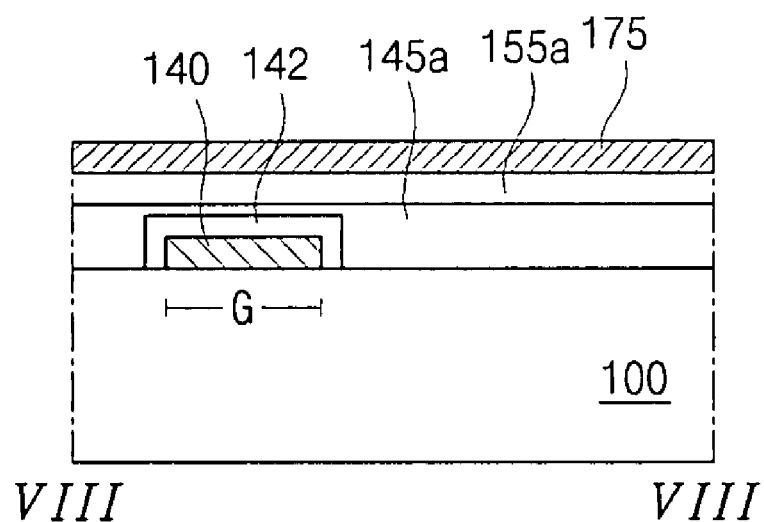
Figure 9C:
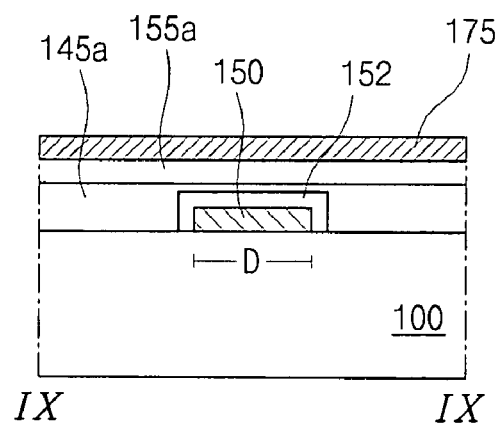

In FIG. 7C, FIG. 8C and FIG. 9C, a low molecular organic material layer 145a is formed substantially on an entire surface of the substrate 100 including the pixel electrode 170 by applying one selected from a low molecular organic material group including pentacene and polythiophene materials, such as P3HT (poly(30hexylthiophene)). Subsequently, an organic insulating layer 155a is formed on the low molecular organic material layer 145a. The organic insulating layer 155a may be formed of one or more selected from an organic insulating material group including fluoropolymer, poly(perfluoro-ethylene-co-butenyl vinyl ether) and polymethyl methacrylate (PMMA). The low molecular organic material layer 145a may be formed by a spin coating method and may have a flat surface.

Next, a gate metallic layer 175 is formed on the substrate 100 including the low molecular organic material layer 145a and the organic insulating layer 155a by depositing a metallic material. The metallic material may be selected from a metallic material group including aluminum (Al), aluminum alloy such as aluminum neodymium (AlNd), molybdenum (Mo), gold (Au) and chromium (Cr).

Figure 7D:
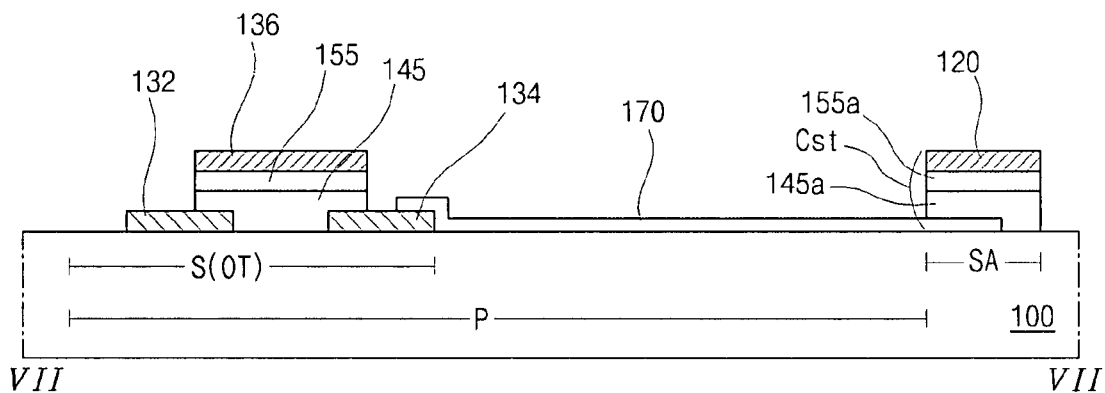
Figure 8D:
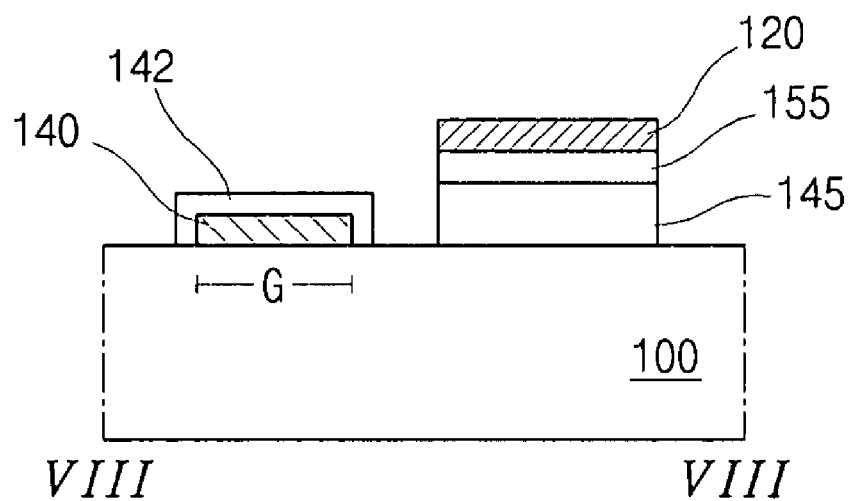
Figure 9D:
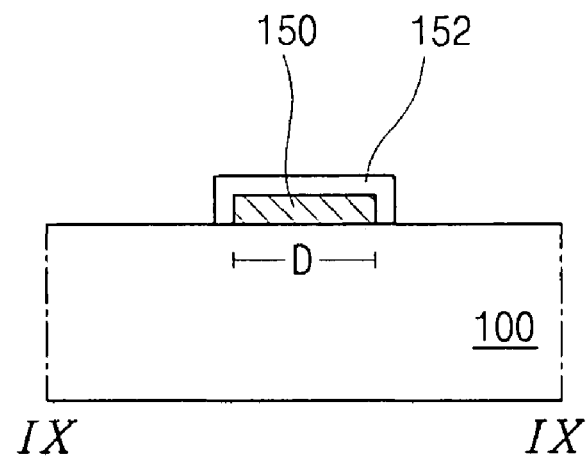

In FIG. 7D, FIG. 8D and FIG. 9D, the low molecular organic material layer 145a, the organic insulating layer 155a and the gate metallic layer 175 are patterned to thereby form an organic semiconductor layer 145, a gate insulating layer 155 and a gate electrode 136 in the switching region S. Simultaneously, a gate line 120 is formed along a direction crossing the data line 130 of FIG. 6 and is connected to the gate electrode 136. The organic semiconductor layer 145 and the gate insulating layer 155 are extended under the gate line 120. The gate pad 140 and the gate line 120 adjacent thereto are spaced apart from and are electrically disconnected with each other. The gate line 120 also corresponds to the storage region SA and overlaps the pixel electrode 170. The pixel electrode 170 and the gate line 120 function as a first electrode and a second electrode, respectively, to thereby form a storage capacitor Cst.

Figure 7E:
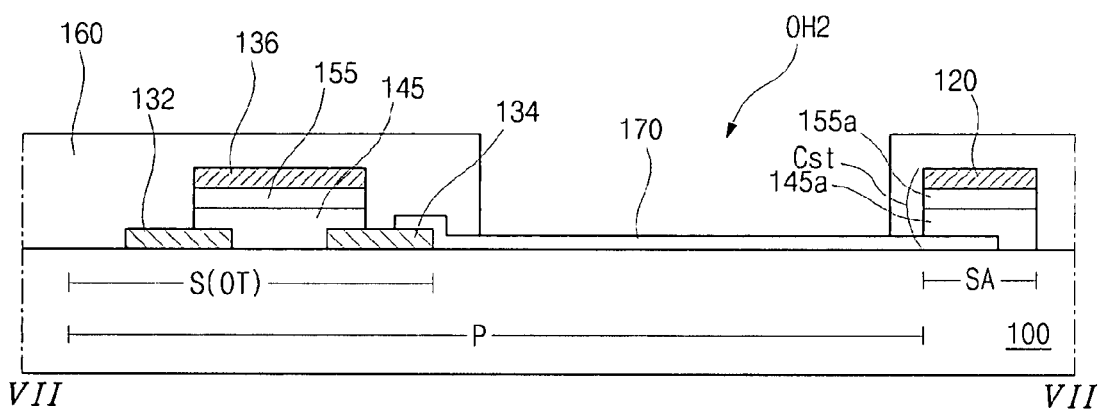
Figure 8E:
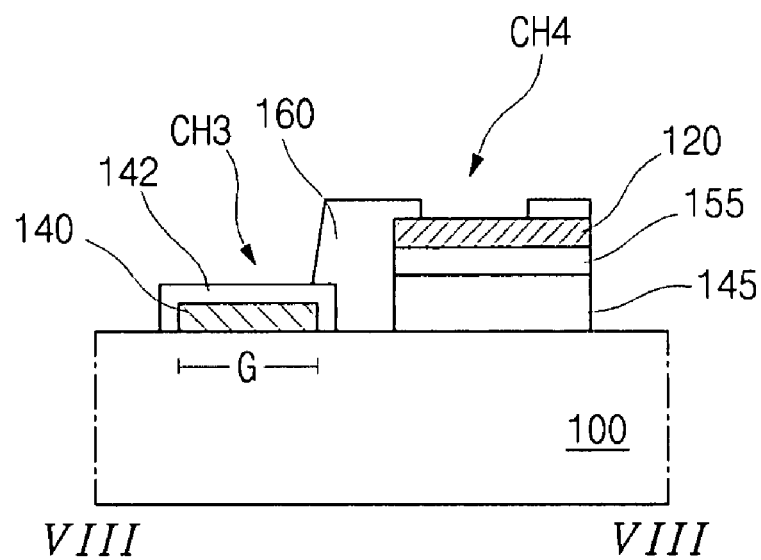
Figure 9E:
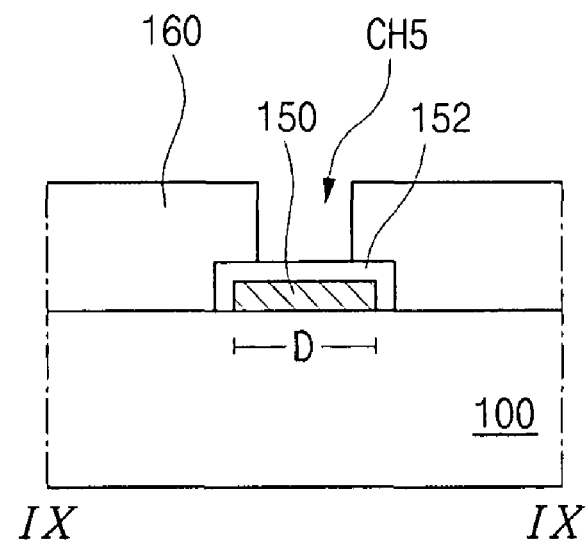

In FIG. 7E, FIG. 8E and FIG. 9E, a passivation layer 160 is formed on the substrate 100 including the gate electrode 136. The passivation layer 160 may be one selected from an organic insulating material group. The passivation layer 160 is patterned to thereby form a gate pad contact hole CH3, a gate contact hole CH4, a data pad contact hole CH5, and a pixel opening OH2. The gate pad contact hole CH3 exposes the gate pad terminal 142. The gate contact hole CH4 partially exposes the gate line 120 adjacent to the gate pad 140 and the gate pad terminal 142. The data pad contact hole CH5 exposes the data pad terminal 152. The pixel opening OH2 exposes the pixel electrode 170.

Figure 7F:
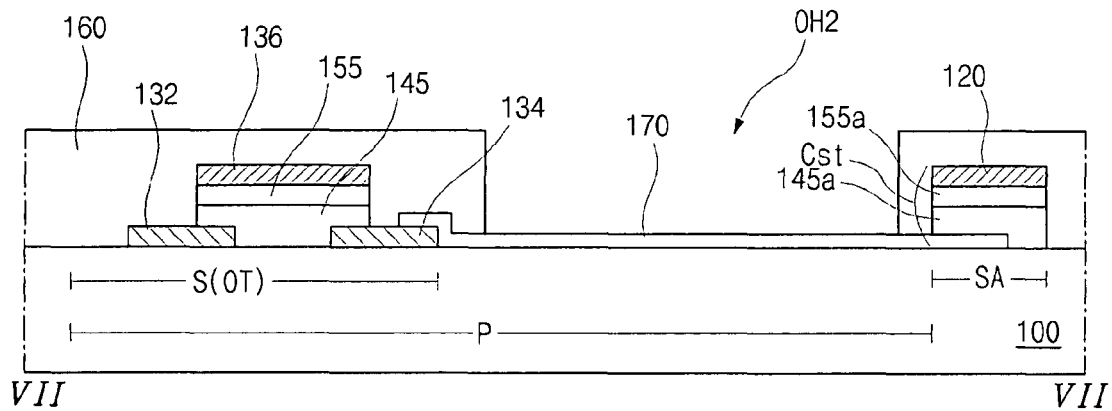
Figure 8F:
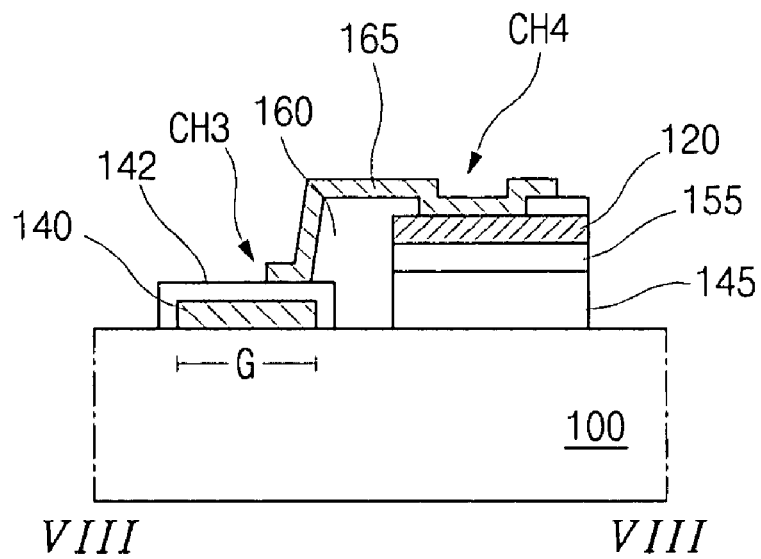
Figure 9F:
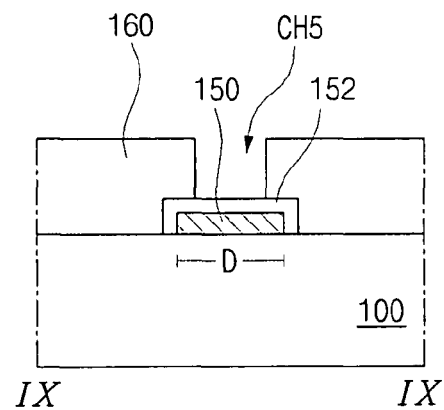

In FIG. 7F, FIG. 8F and FIG. 9F, a metallic layer (not shown) is deposited on the passivation layer 160 and then is patterned to thereby form a connecting pattern 165. The connecting pattern 165 connects the gate pad terminal 142 and the gate line 120 adjacent thereto. The connecting pattern 165 may be one selected from a conductive metallic group including chromium (Cr), molybdenum (Mo) or aluminum alloy such as aluminum neodymium (AlNd).

The array substrate can be manufactured through the above-mentioned processes according to the first embodiment of the invention.

In a second embodiment of the invention, the gate pad portion may have a single-layered structure of a transparent conductive material. That is, the gate pad portion includes only a gate pad terminal of a transparent conductive material. Hereinafter, a method of manufacturing an array substrate for an OTFT LCD device according to the second embodiment will be described with reference to accompanying drawings. The second embodiment is partially changed from the first embodiment, and descriptions will focus on its distinctive features.

Figure 10A:
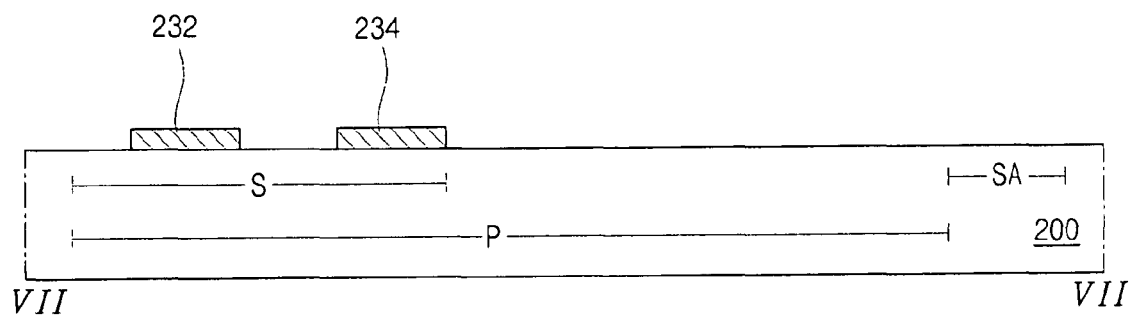
FIGS. 10A and 10B, FIGS. 11A and 11B, and FIGS. 12A and 12B are cross-sectional views illustrating a method of manufacturing an array substrate for an OTFT LCD device according to a second embodiment.
Figure 10B:
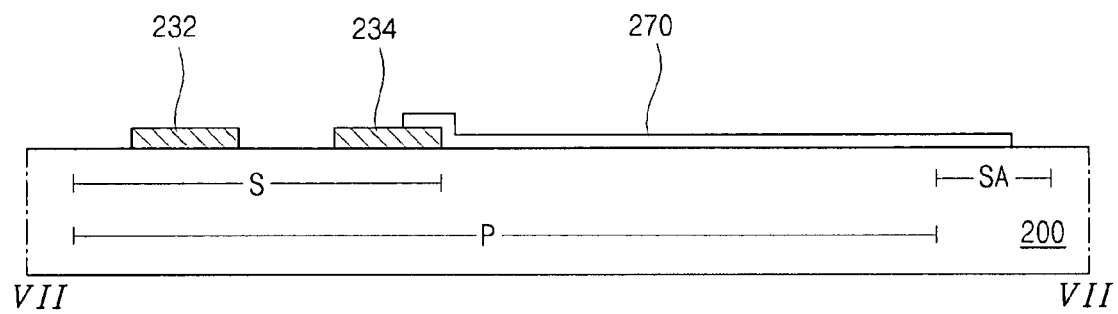
Figure 11A:
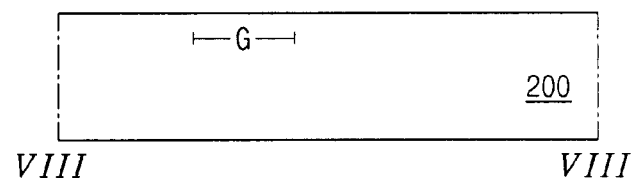
Figure 11B:
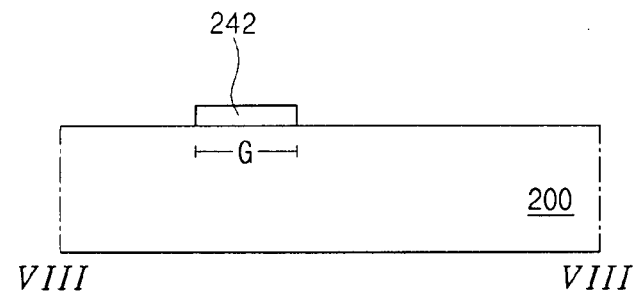
Figure 12A:
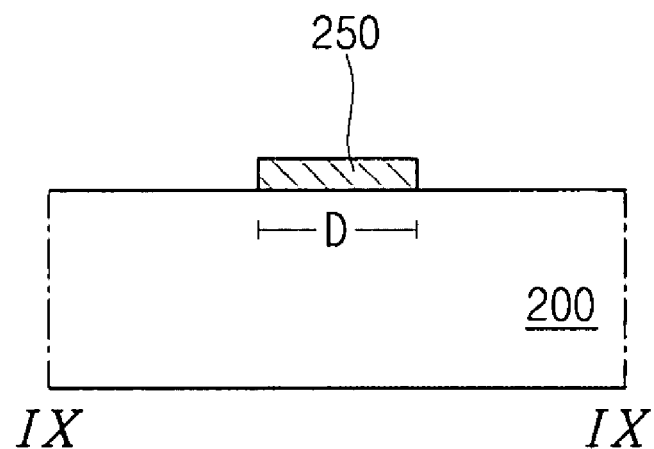
Figure 12B:
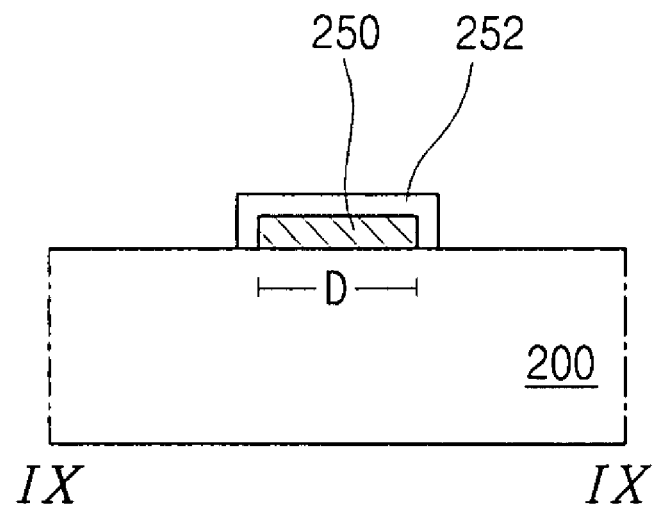

FIGS. 10A and 10B, FIGS. 11A and 11B, and FIGS. 12A and 12B illustrate a method of manufacturing an array substrate for an OTFT LCD device according to the second embodiment. FIGS. 10A and 10B are cross-sectional views along the line VII-VII of FIG. 6. FIGS. 11A and 11B are cross-sectional views along the line VIII-VIII of FIG. 6. FIGS. 12A and 12B are cross-sectional views along the line IX-IX of FIG. 6.

In FIG. 10A, FIG. 11A and FIG. 12A, a switching region S, a pixel region P, a storage region SA, a gate region G, and a data region D are defined on a substrate 200. The storage region SA may be a part of another gate region, which is adjacent to a side of the pixel region P opposite to the gate region G.

A metallic material is deposited on the substrate 200 where the regions S, P, SA, G and D are defined. Then, the metallic material is patterned to thereby form a source electrode 232, a drain electrode 234 and a data line 130 of FIG. 6. The source and drain electrodes 232 and 234 are disposed in the switching region S. The data line 130 is disposed in the data region D and has a data pad 250 at one end thereof. The metallic material may be one or more selected from a conductive metallic group including aluminum (Al), aluminum alloy such as aluminum neodymium (AlNd), molybdenum (Mo), tungsten (W), chromium (Cr), and cold (Au).

In FIG. 10B, FIG. 11B and FIG. 12B, a transparent conductive material is deposited on the substrate 200 including the source and drain electrodes 232 and 234 and then is patterned to thereby form a pixel electrode 270, a data pad terminal 252, and a gate pad terminal 242. The pixel electrode 270 is disposed in the pixel region P and directly contacts a part of the drain electrode 234. The data pad terminal 252 corresponds to the data region D and covers the data pad 250. The gate pad terminal 242 corresponds to the gate region G and has an island shape. The gate pad terminal 242 is electrically isolated. The transparent conductive material may be one selected from a transparent conductive material group including indium tin oxide (ITO) and indium zinc oxide (IZO).

In the second embodiment, the gate pad portion includes only the gate pad terminal of a transparent conductive material and has a single-layered structure.

Next steps of the second embodiment are the same as the first embodiment, and the descriptions for the steps will be omitted.

In the first and second embodiments, since the gate line, the gate electrode, the gate insulating layer, and the organic semiconductor layer are simultaneously patterned, the organic semiconductor layer and the gate insulating layer are extended under the gate line.

In a third embodiment of the invention, a gate electrode and a gate line are formed in different layers as compared with the first embodiment. That is, the gate electrode has an island shape. The gate line is formed in a different layer from the gate electrode and is connected to the gate electrode through a contact hole. The gate line is also formed in a different layer from a gate pad and is electrically connected to the gate pad through a contact hole. In addition, an organic semiconductor layer is formed just under the gate electrode, and currents are prevented from running through adjacent pixel regions due to the organic semiconductor layer under the gate line. Thus, signal delay may be prevented.

Hereinafter, an array substrate for an OTFT LCD device according to the third embodiment will be described with reference to accompanying drawings.

Figure 13:
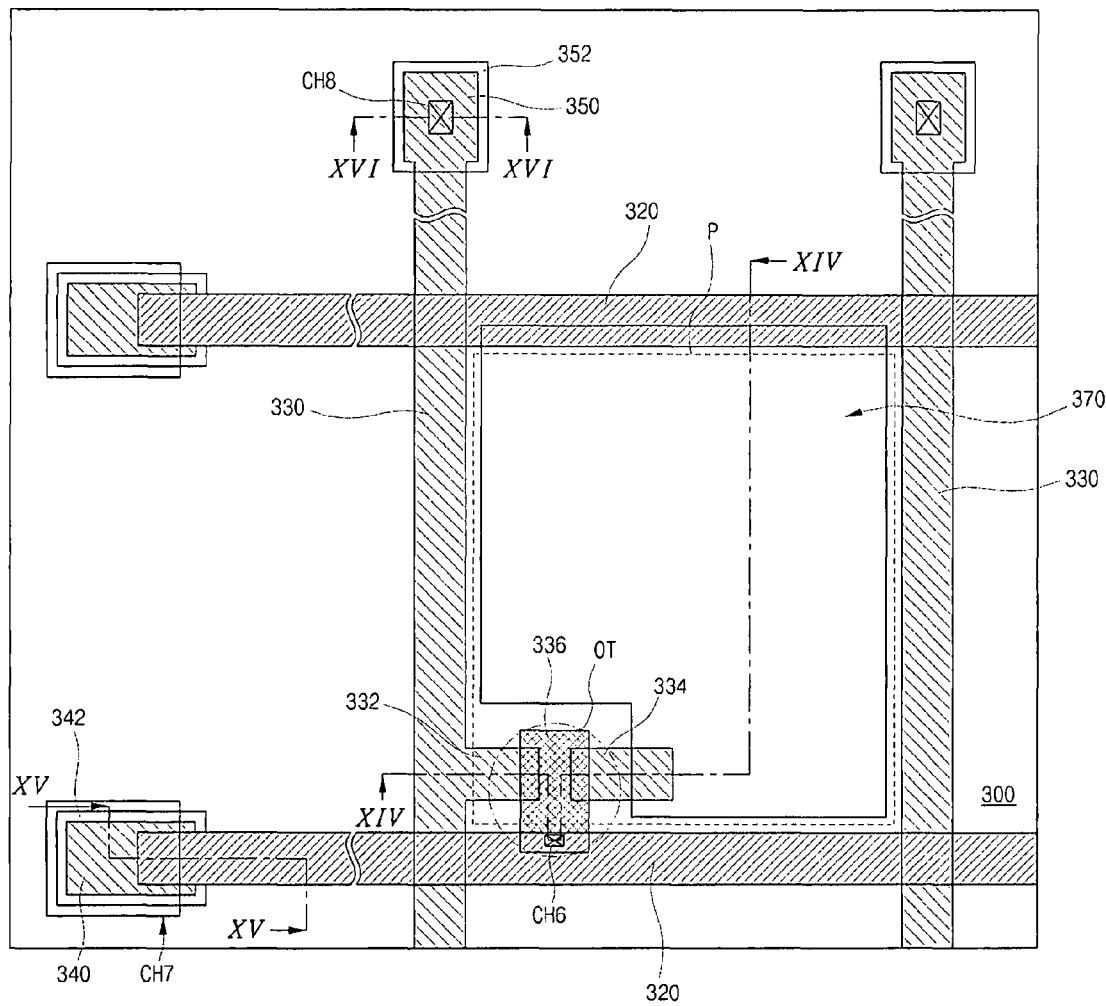
FIG. 13 is a plane view illustrating a pixel of an array substrate for an OTFT LCD device according to a third embodiment of the invention.

FIG. 13 is a plane view illustrating a pixel of an array substrate for an OTFT LCD device according to the third embodiment of the invention. In FIG. 13, gate lines 320 are formed on a substrate 300 along a first direction. A gate pad 340 of an island shape is formed at one end of each gate line 320. A gate pad terminal 342 of a transparent conductive material is formed on the gate pad 340 and covers the gate pad 340. The gate pad 340 and the gate pad terminal 342 overlap the gate line 320 and are electrically connected to the gate line 320 through a gate pad contact hole CH7. Data lines 330 are formed along a second direction and perpendicularly cross the gate lines 320 to define pixel regions P. A data pad 350 is formed at one end of each data line 330 and is connected to the data line 330. A data pad terminal 352 of a transparent conductive material is formed on the data pad 350 and covers the data pad 350.

An organic thin film transistor OT is formed at each crossing portion of the gate and data lines 320 and 330. The organic thin film transistor OT includes a gate electrode 336, an organic semiconductor layer (not shown), a source electrode 332 and a drain electrode 334. The source electrode 332 is connected to the data line 330, and the drain electrode 334 is spaced apart from the source electrode 332. The organic semiconductor layer partially overlaps the source electrode 332 and the drain electrode 334. The gate electrode 336 is formed over the organic semiconductor layer and has an island shape. The gate electrode 336 overlaps the gate line 320 and is electrically connected to the gate line 320 through a gate contact hole CH6.

A pixel electrode 370 is formed at each pixel region P. The pixel electrode 370 directly contacts the drain electrode 334. The pixel electrode 370 is spaced apart from the corresponding gate line 320, the data lines 330 and other parts of the organic thin film transistor OT. The pixel electrode 370 partially overlaps another gate line 320 adjacent thereto with a gate insulating layer (not shown) interposed therebetween.

A method of manufacturing an array substrate for an OTFT LCD device according to the third embodiment will be described in detail with reference to accompanying drawings.

FIGS. 14A to 14F, FIGS. 15A to 15F, and FIGS. 16A to 16F illustrate a method of manufacturing an array substrate for an OTFT LCD device according to the third embodiment of the invention. FIGS. 14A to 14F are cross-sectional views along the line XIV-XIV of FIG. 13. FIGS. 15A to 15F are cross-sectional views along the line XV-XV of FIG. 13. FIGS. 16A to 16F are cross-sectional views along the line XIV-XIV of FIG. 13.

Figure 14A:
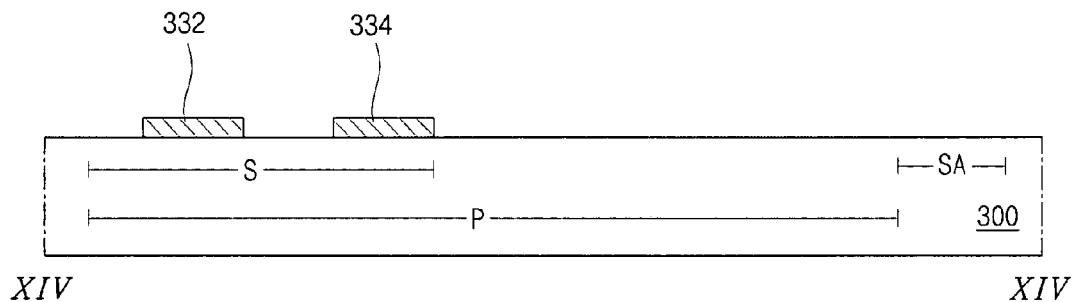
FIGS. 14A to 14F, FIGS. 15A to 15F, and FIGS. 16A to 16F are cross-sectional views illustrating a method of manufacturing an array substrate for an OTFT LCD device according to the third embodiment of the invention.
Figure 15A:
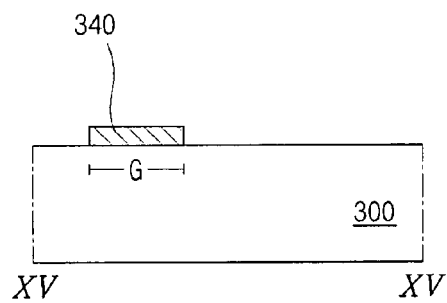
Figure 16A:
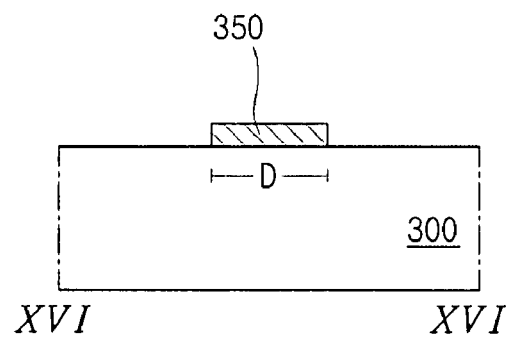

In FIG. 14A, FIG. 15A and FIG. 16A, a switching region S, a pixel region P, a storage region SA, a gate region G, and a data region D are defined on a substrate 300. The storage region SA may be a part of another gate region, which is adjacent to a side of the pixel region P opposite to the gate region G.

A metallic material is deposited on the substrate 300 where the regions S, P, SA, G and D are defined. Then, the metallic material is patterned through a photolithographic process, which includes applying, exposing to light and developing photoresist, etching the metallic material, and removing the photoresist, to thereby form a source electrode 332, a drain electrode 334, a gate pad 340 and a data line 330 of FIG. 13. The source and drain electrodes 332 and 334 are disposed in the switching region S. The gate pad 340 is disposed in the gate region G and has an island shape. The data line 330 is disposed in the data region D and has a data pad 350 at one end thereof. The metallic material may be one or more selected from a conductive metallic group including aluminum (Al), aluminum alloy such as aluminum neodymium (AlNd), molybdenum (Mo), tungsten (W), chromium (Cr), and cold (Au).

Figure 14B:
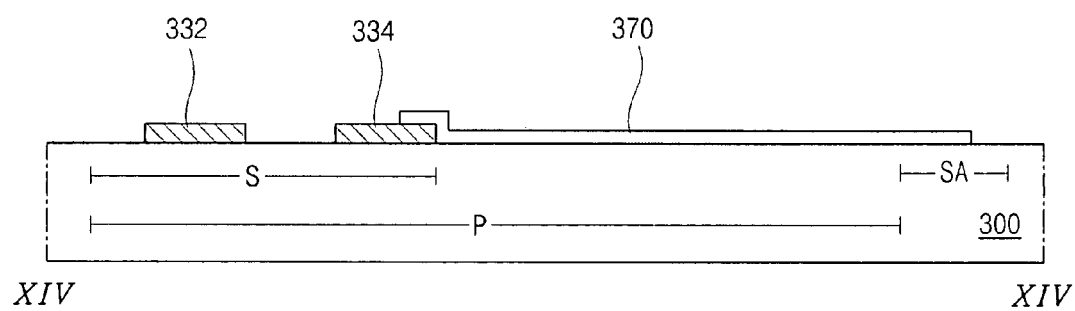
Figure 15B:
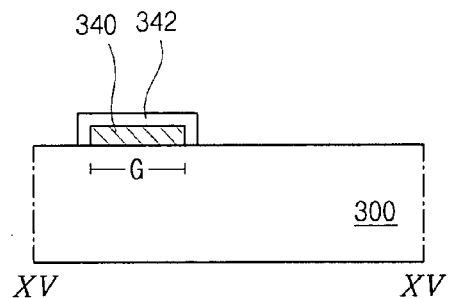
Figure 16B:
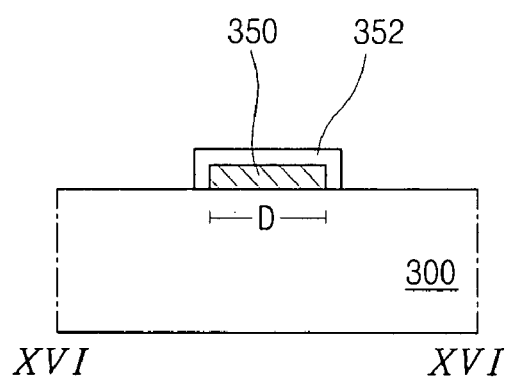

In FIG. 14B, FIG. 15B and FIG. 16B, a transparent conductive material is deposited on the substrate 300 including the source and drain electrodes 332 and 334 and then is patterned to thereby form a pixel electrode 370, a gate pad terminal 342, and a data pad terminal 352. The pixel electrode 370 is disposed in the pixel region P and directly contacts a part of the drain electrode 334. The pixel electrode 370 may be extended into the storage region SA and may function as an electrode of a storage capacitor. The gate pad terminal 342 corresponds to the gate region G and covers the gate pad 340. The data pad terminal 352 corresponds to the data region D and covers the data pad 350. The transparent conductive material may be one selected from a transparent conductive material group including indium tin oxide (ITO) and indium zinc oxide (IZO).

Figure 14C:
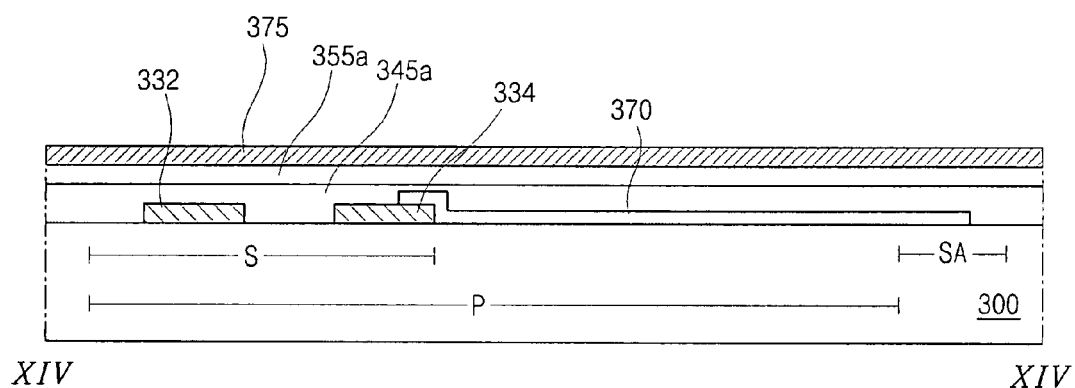
Figure 15C:
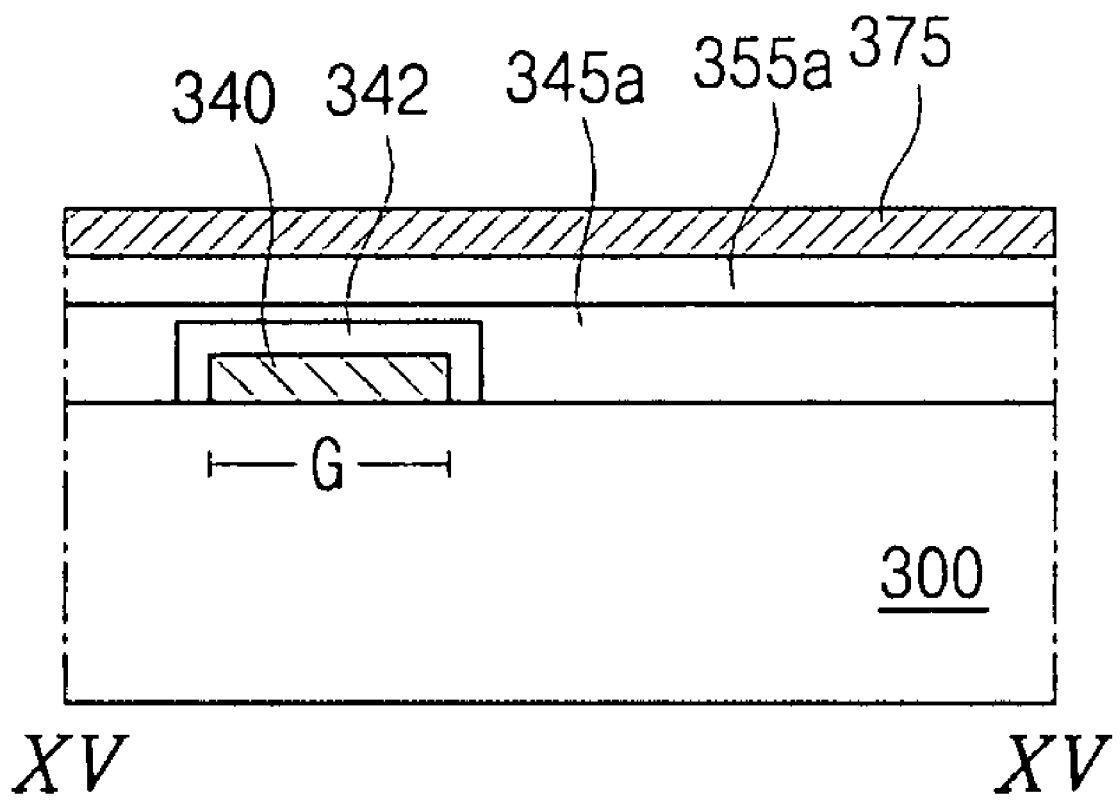
Figure 16C:
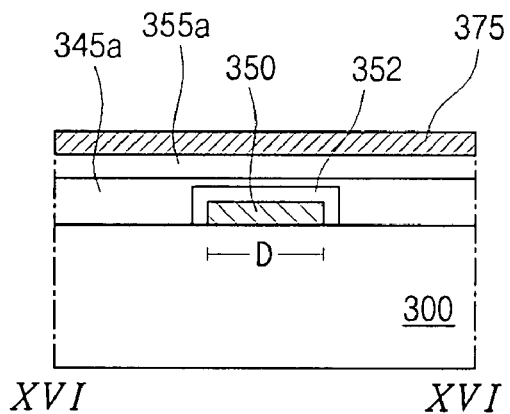

In FIG. 14C, FIG. 15C and FIG. 16C, a low molecular organic material layer 345a is formed substantially on an entire surface of the substrate 300 including the pixel electrode 370 by applying one selected from a low molecular organic material group including pentacene and polythiophene materials, such as P3HT (poly(30hexylthiophene)). Subsequently, an organic insulating layer 355a is formed on the low molecular organic material layer 345a. The organic insulating layer 355a may be formed of one or more selected from an organic insulating material group including fluoropolymer, poly(perfluoro-ethylene-co-butenyl vinyl ether) and polymethyl methacrylate (PMMA). The low molecular organic material layer 345a may be formed by a spin coating method and may have a flat surface.

Next, a first gate metallic layer 375 is formed on the substrate 300 including the low molecular organic material layer 345a and the organic insulating layer 355a by depositing a metallic material. The metallic material may be selected from a metallic material group including aluminum (Al), aluminum alloy such as aluminum neodymium (AlNd), molybdenum (Mo), gold (Au) and chromium (Cr).

Figure 14D:
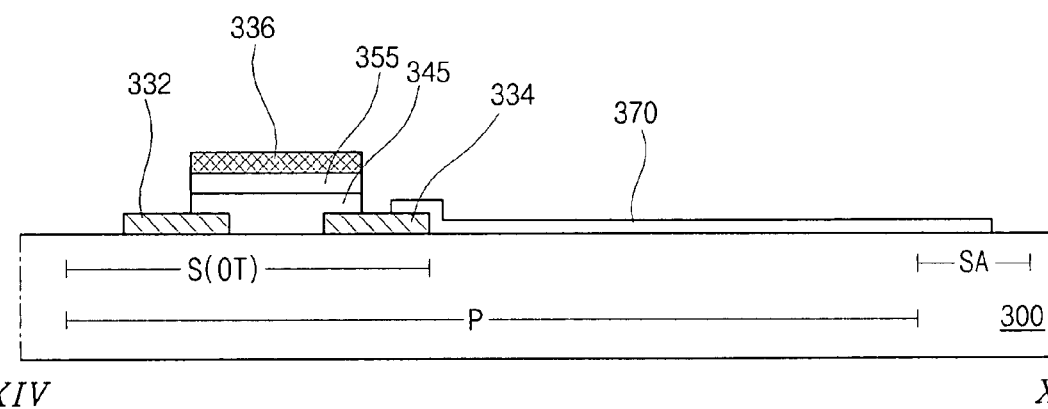
Figure 15D:
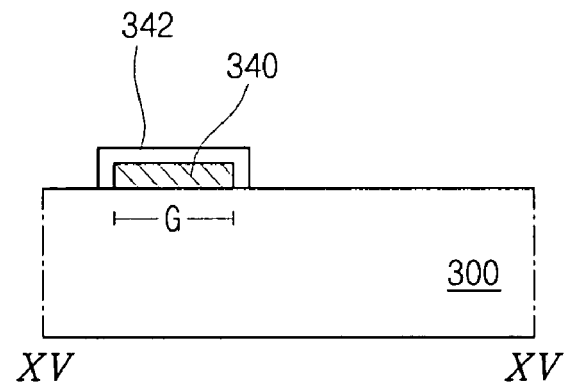
Figure 16D:
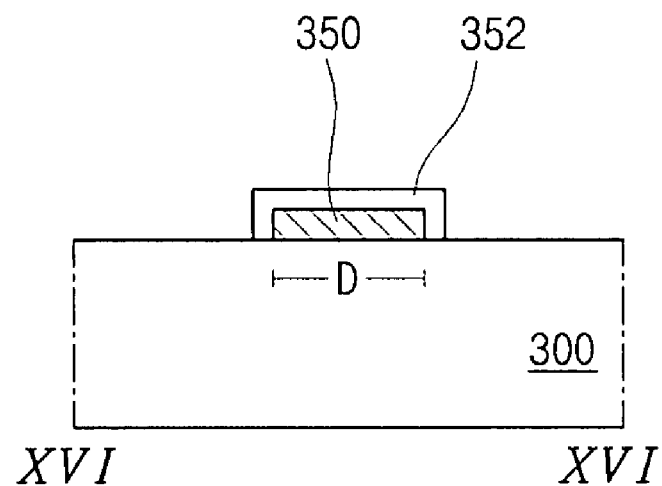

In FIG. 14D, FIG. 15D and FIG. 16D, the low molecular organic material layer 345a, the organic insulating layer 355a and the gate metallic layer 375 are patterned to thereby form an organic semiconductor layer 345, a gate insulating layer 355 and a gate electrode 336 in the switching region S. The organic semiconductor layer 345, the gate insulating layer 355 and the gate electrode 336 have the same island shape.

Figure 14E:
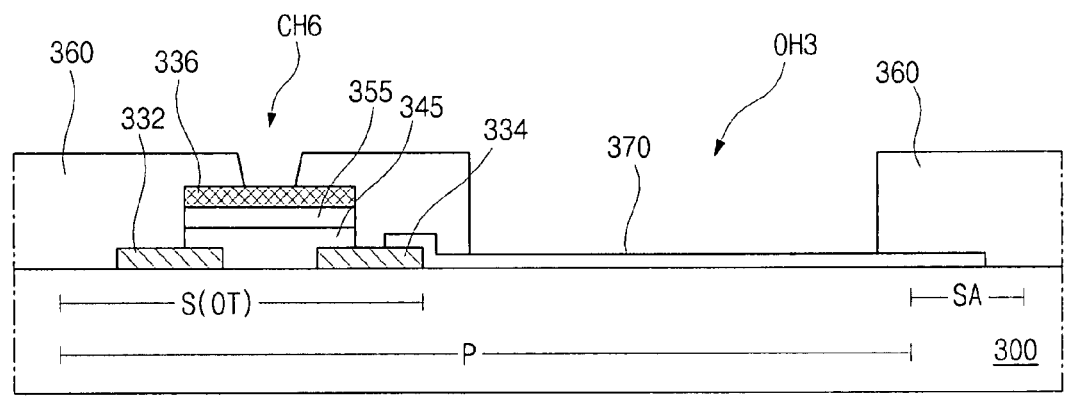
Figure 15E:
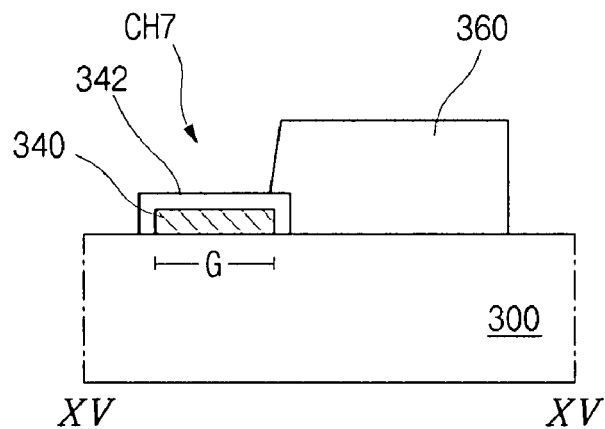
Figure 16E:
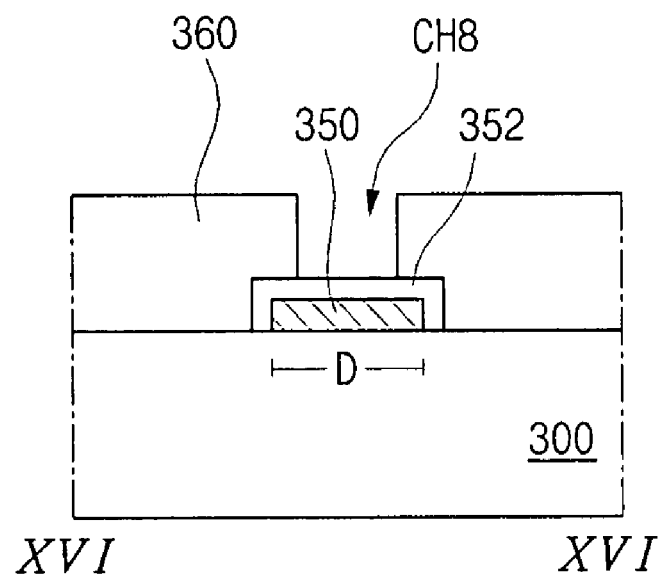

In FIG. 14E, FIG. 15E and FIG. 16E, a passivation layer 360 is formed on the substrate 300 including the gate electrode 336. The passivation layer 360 may be one selected from an organic insulating material group. The passivation layer 360 is patterned to thereby form a gate contact hole CH6, a gate pad contact hole CH7, a data pad contact hole CH8, and a pixel opening OH3. The gate contact hole CH6 exposes the gate electrode 336. The gate pad contact hole CH7 exposes the gate pad terminal 342. The data pad contact hole CH8 exposes the data pad terminal 352. The pixel opening OH3 exposes the pixel electrode 370.

Figure 14F:
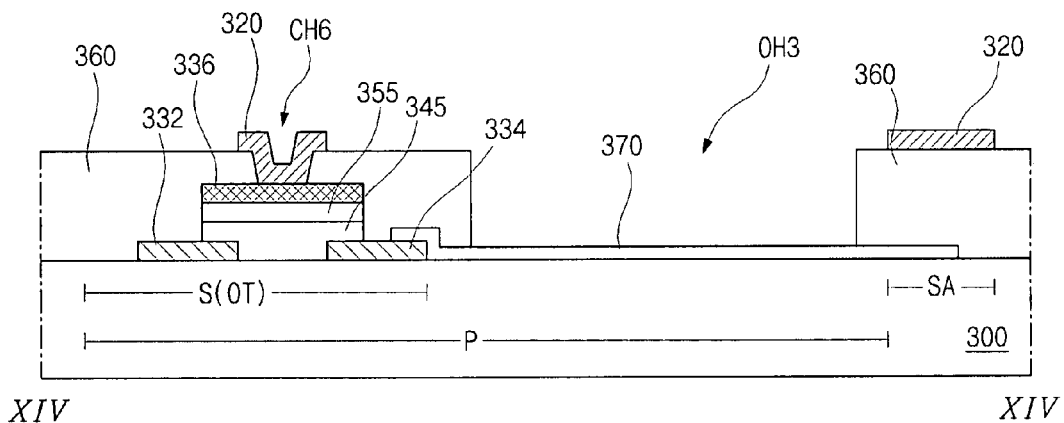
Figure 15F:
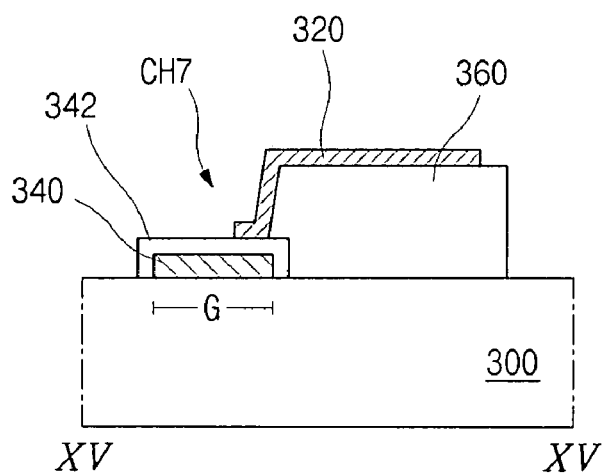
Figure 16F:
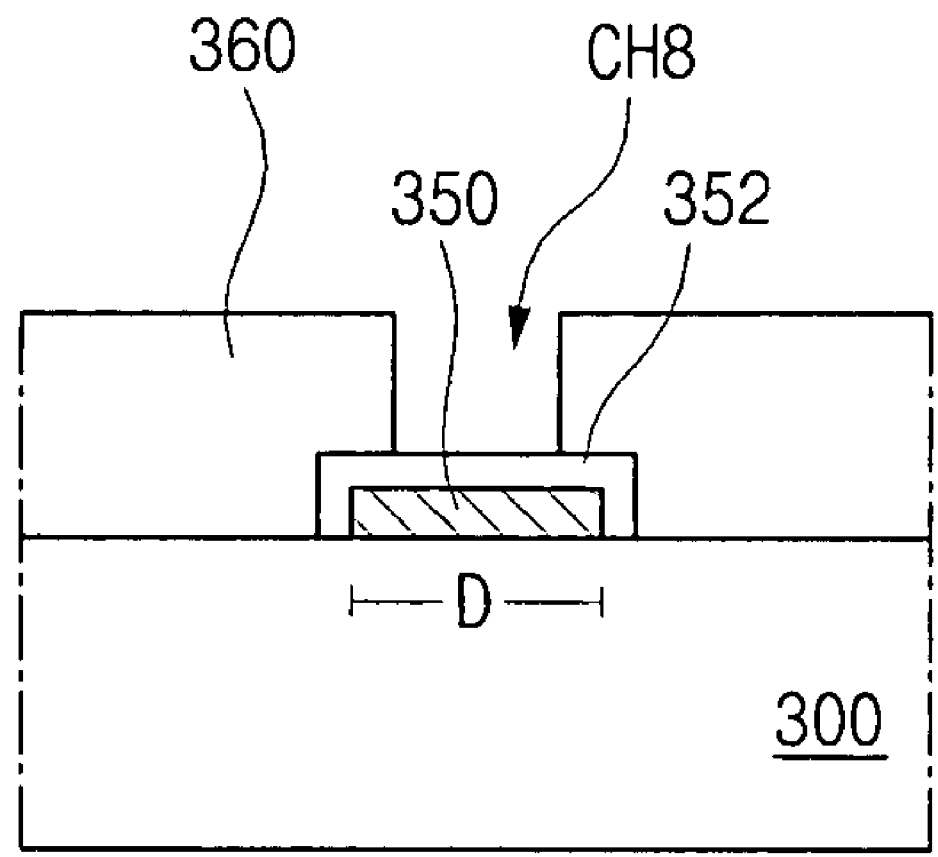

In FIG. 14F, FIG. 15F and FIG. 16F, a second gate metallic layer (not shown) is deposited on the passivation layer 360 and then is patterned to thereby form a gate line 320. The gate line 320 is formed along a direction crossing the data line 330 of FIG. 13. The gate line 320 is connected to the gate electrode 336 through the gate contact hole CH6 and is connected to the gate pad terminal 342 through the gate pad contact hole CH7.

In the third embodiment, the gate pad 340, the gate electrode 336 and the gate line 320 are formed of different materials and in different layers from one another. That is, the gate pad 340 has an island shape and is formed in the same process with the source and drain electrodes 332 and 334. The gate electrode 336 has an island shape and is formed in the same process with the organic semiconductor layer 345. After that, the gate line 320 is formed on the gate electrode 336. Accordingly, there is no organic semiconductor layer under the gate line 320, and signal delay can be prevented. Alternatively, the gate electrode 336 and the gate line 320 may be formed of the same material.

Here, the gate pad portion has a double-layered structure of the gate pad and the gate pad terminal. However, the gate pad portion may have a single-layered structure of the gate pad terminal.

In the invention, the gate pad portion has a single-layered structure of an opaque metallic material and a transparent conductive material on the metallic material or a double-layered structure of a transparent conductive material. Accordingly, even though misalignment occurs during a TAB package process for connecting a gate driver to the gate pad portion, the package process can be repeatedly performed without the metallic material of the gate pad potion being torn off or corroded.

Moreover, since the gate electrode is formed in the same process with the organic semiconductor layer and the gate line is formed in a different process from the gate electrode, there is no organic semiconductor layer under the gate line. Therefore, the signal delay may be prevented.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An array substrate for an organic thin film transistor liquid crystal display device, comprising:
   a substrate;
   a data line on the substrate;
   a first gate line crossing the data line to define a pixel region;
   an organic thin film transistor electrically connected to the first gate line and the data line, the organic thin film transistor including source and drain electrodes, an organic semiconductor layer on the source and drain electrodes, a gate electrode on the organic semiconductor layer;
   a pixel electrode in the pixel region and connected to the drain electrode;
   a gate pad terminal electrically connected to the first gate line and including a transparent conductive material;
   a data pad terminal electrically connected to the data line and including a transparent conductive material; and
   a passivation layer covering the organic thin film transistor and including a pixel opening, a gate pad contact hole and a data pad contact hole exposing the pixel electrode, the gate pad terminal, and the data pad terminal, respectively.

2. The array substrate according to claim 1, further comprising a connecting pattern on the passivation layer, wherein the connecting pattern connects the first gate line and the gate pad terminal.

3. The array substrate according to claim 1, further comprising a gate pad electrically connected to the first gate line, wherein the gate pad is formed of a same material and in a same layer as the data line, and the gate pad terminal covers the gate pad.

4. The array substrate according to claim 3, further comprising a data pad extending from the data line, wherein the data pad terminal covers the data pad.

5. The array substrate according to claim 1, wherein the gate electrode extends from the first gate line, and the organic semiconductor layer extends under the first gate line.

6. The array substrate according to claim 5, further comprising a gate insulating layer between the organic semiconductor layer and the gate electrode and between the organic semiconductor layer and the first gate line.

7. The array substrate according to claim 1, wherein the first gate line is disposed on the passivation layer and is connected to the gate electrode through a contact hole.

8. The array substrate according to claim 7, further comprising a gate pad electrically connected to the first gate line, wherein the gate pad is formed of a same material and in a same layer as the data line, and the gate pad terminal covers the gate pad.

9. The array substrate according to claim 1, wherein the pixel electrode overlaps a second gate line to constitute a storage capacitor.

* * * * *